United States Patent
Weed

(10) Patent No.: US 10,186,446 B2
(45) Date of Patent: *Jan. 22, 2019

(54) ADJUSTABLE CIRCUMFERENCE ELECTROSTATIC CLAMP

(71) Applicant: Axcelis Technologies, Inc., Beverly, MA (US)

(72) Inventor: Allan D. Weed, Marblehead, MA (US)

(73) Assignee: Axcelis Technology, Inc., Beverly, MA (US)

( * ) Notice: Subject to any disclaimer, the term of this patent is extended or adjusted under 35 U.S.C. 154(b) by 133 days.

This patent is subject to a terminal disclaimer.

(21) Appl. No.: 15/281,540

(22) Filed: Sep. 30, 2016

(65) Prior Publication Data
US 2018/0096875 A1    Apr. 5, 2018

(51) Int. Cl.
*H01L 21/683* (2006.01)
*H01J 37/20* (2006.01)
(Continued)

(52) U.S. Cl.
CPC .......... *H01L 21/6833* (2013.01); *H01J 37/20* (2013.01); *H01J 37/31* (2013.01);
(Continued)

(58) Field of Classification Search
CPC ................ H01J 37/185; H01J 37/3171; H01J 2237/2007; H01J 37/32715;
(Continued)

(56) References Cited

U.S. PATENT DOCUMENTS 6,313,469 B1    11/2001    Tamal
6,442,858 B1     9/2002    Asano
(Continued)

FOREIGN PATENT DOCUMENTS

CN    105336561 A    2/2016
FR      3004287 A1   10/2014
(Continued)

OTHER PUBLICATIONS

International Search Report and Written Opinion dated Nov. 14, 2017 for International Application No. PCT/US2017/053959.
(Continued)

*Primary Examiner* — Wyatt Stoffa
(74) *Attorney, Agent, or Firm* — Eschweiler & Potashnik, LLC

(57) ABSTRACT

An electrostatic chuck for clamping workpieces having differing diameters is provided. A central electrostatic chuck member associated with a first workpiece and a first peripheral electrostatic chuck member associated with a second workpiece are provided. An elevator translates the first peripheral electrostatic chuck member with respect to central electrostatic chuck member between a retracted position and an extended position. In the retracted position, the first workpiece contacts only the first surface. In the extended position, the second workpiece contacts the first surface and the second surface. A first peripheral shield generally shields the second surface when the first peripheral electrostatic chuck member is in the retracted position. Additional peripheral electrostatic chuck members and peripheral shields can be added to accommodate additional workpiece diameters.

26 Claims, 17 Drawing Sheets

(51) Int. Cl.
*H01J 37/317* (2006.01)
*H01L 21/265* (2006.01)
*H01L 21/67* (2006.01)
*H01J 37/31* (2006.01)
*H01L 21/677* (2006.01)
*H01L 21/687* (2006.01)

(52) U.S. Cl.
CPC ........ *H01J 37/3171* (2013.01); *H01L 21/265* (2013.01); *H01L 21/67213* (2013.01); *H01L 21/67751* (2013.01); *H01L 21/6831* (2013.01); *H01L 21/68707* (2013.01); *H01L 21/68728* (2013.01); *H01L 21/68785* (2013.01)

(58) Field of Classification Search
CPC ........... H01L 21/67742; H01L 21/6833; H01L 21/68707; H01L 21/6831; H01L 21/68735
See application file for complete search history.

(56) References Cited

U.S. PATENT DOCUMENTS

| | | | |
|---|---|---|---|
| 7,057,192 B2 | 6/2006 | Kaim et al. | |
| 7,763,863 B2 * | 7/2010 | Mizuochi | H01J 37/20 219/390 |
| 9,892,954 B2 * | 2/2018 | Cheng | H01L 21/68785 |
| 9,911,636 B1 * | 3/2018 | Weed | H01J 37/185 |
| 2002/0176096 A1 | 11/2002 | Sentoku | |
| 2007/0183868 A1 | 8/2007 | Son | |
| 2008/0144251 A1 * | 6/2008 | Tao | H01L 21/6833 361/234 |
| 2008/0236749 A1 | 10/2008 | Koshimizu et al. | |
| 2009/0092469 A1 | 4/2009 | Sekimoto | |
| 2010/0055879 A1 | 3/2010 | Harano | |
| 2010/0171044 A1 * | 7/2010 | Lee | H01J 37/20 250/491.1 |
| 2011/0299218 A1 * | 12/2011 | Lee | H01L 21/6831 361/234 |
| 2013/0216336 A1 | 8/2013 | Lee | |
| 2013/0230971 A1 | 9/2013 | Geerpuram et al. | |
| 2014/0361197 A1 | 12/2014 | Lee et al. | |

FOREIGN PATENT DOCUMENTS

| | | |
|---|---|---|
| WO | 2011155987 A1 | 12/2011 |
| WO | 2014157014 A1 | 2/2017 |

OTHER PUBLICATIONS

U.S. Appl. No. 15/281,600, filed Sep. 30, 2016.
Notice of Allowance dated Oct. 24, 2017 in connection with U.S. Appl. No. 15/281,600.
International Search Report and Written Opinion dated Dec. 22, 2017 for International Application No. PCT/US2017/052155.

* cited by examiner

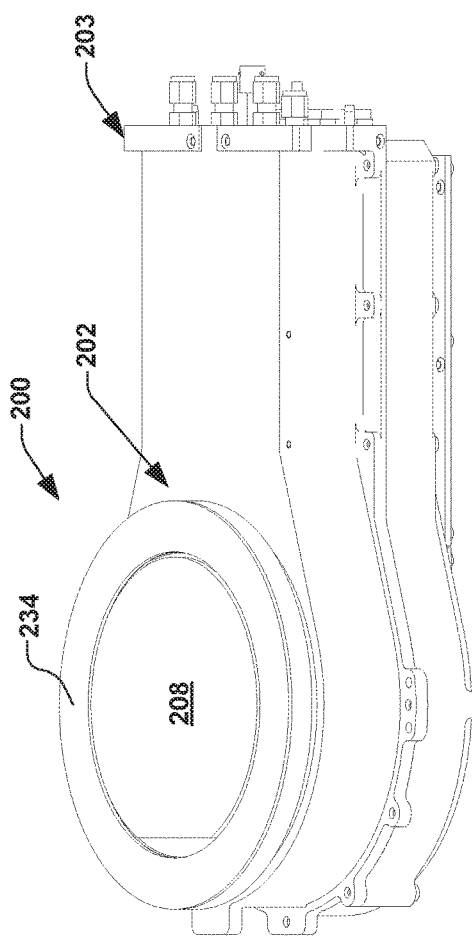
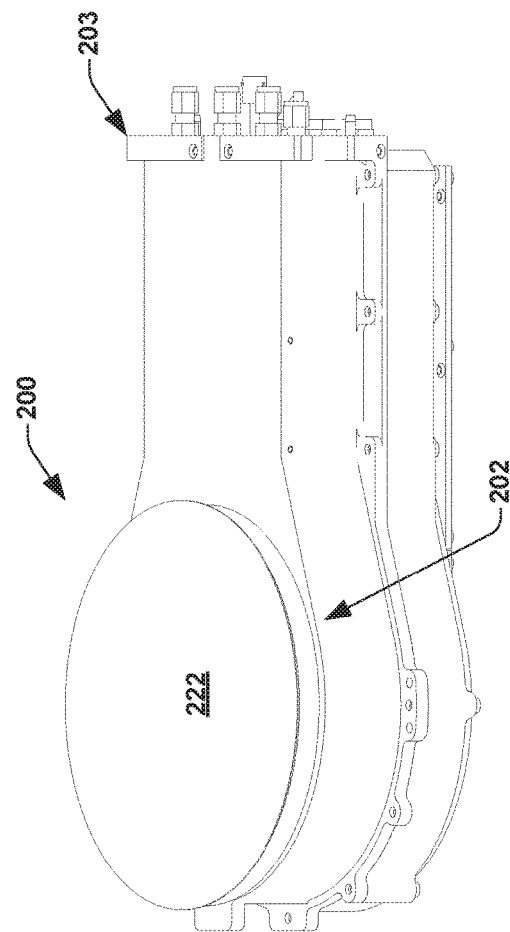
FIG. 2A
FIG. 2B

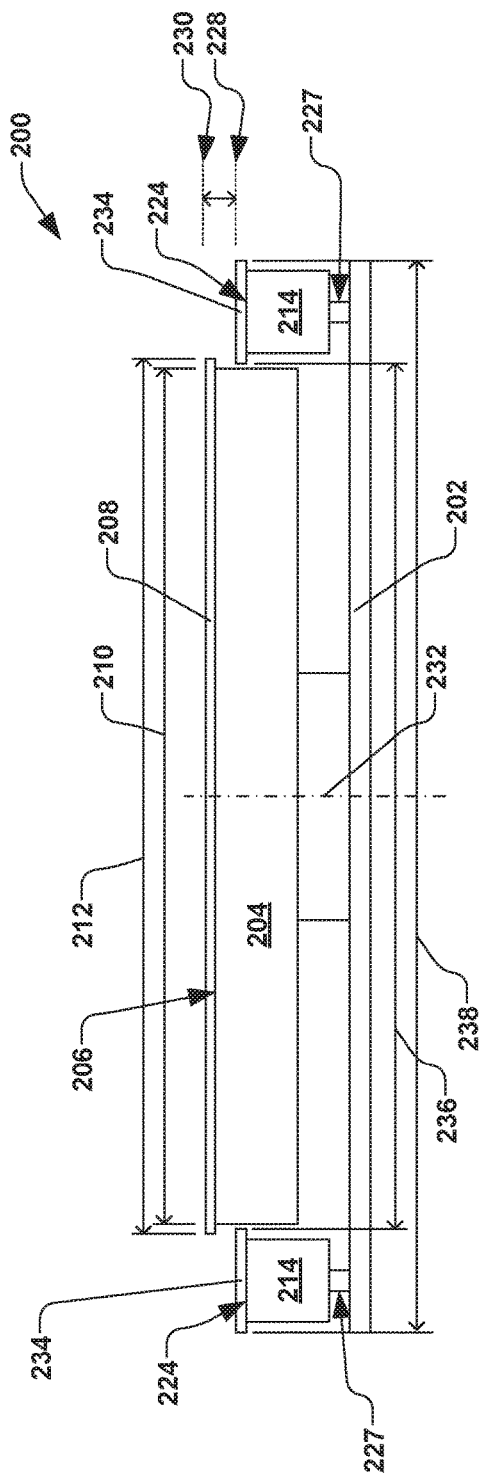
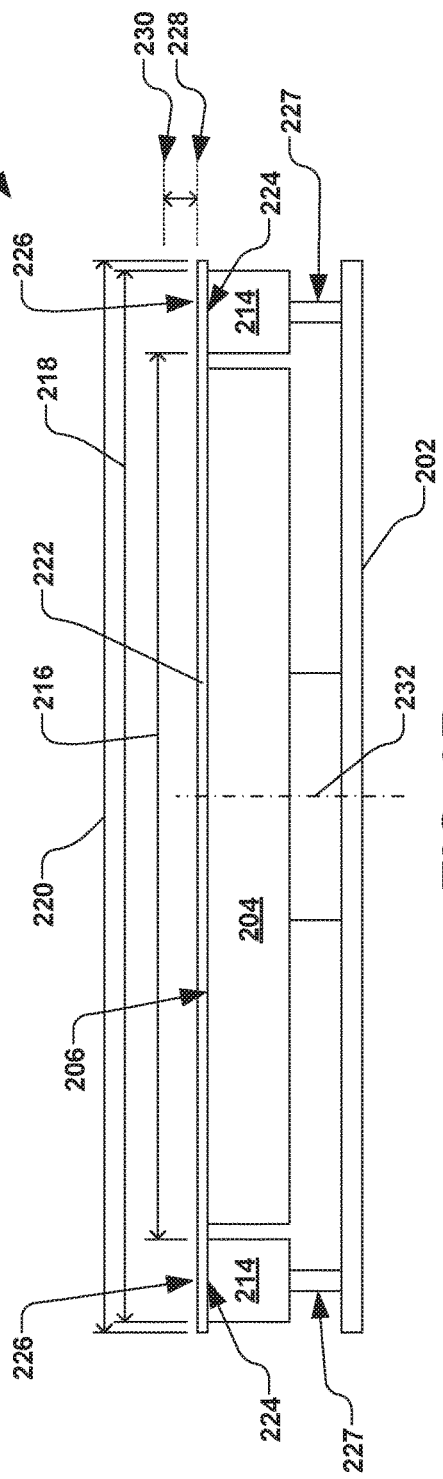
FIG. 3A
FIG. 3B

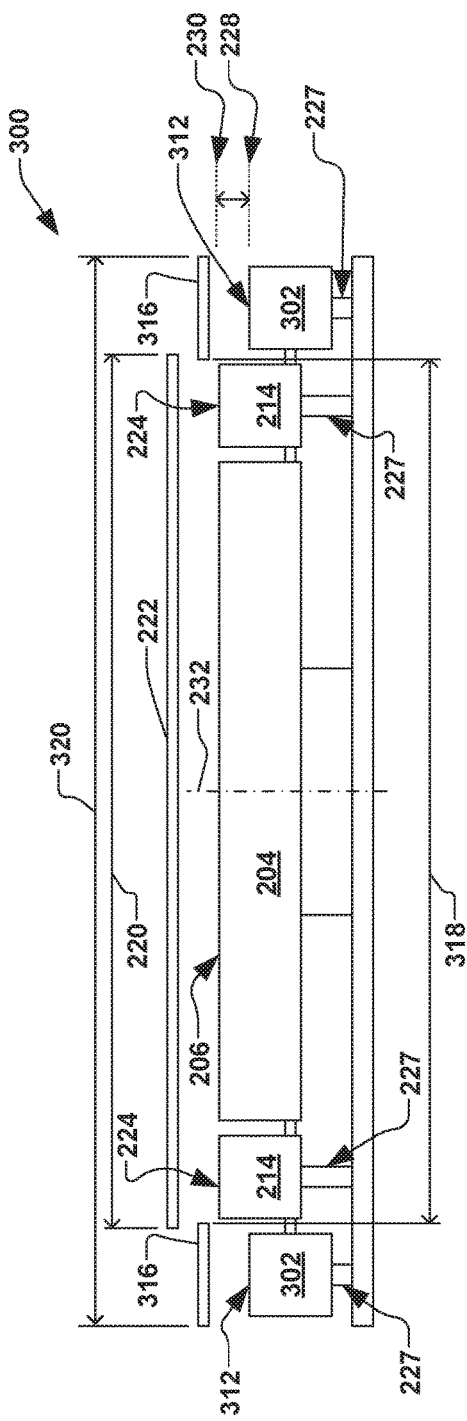
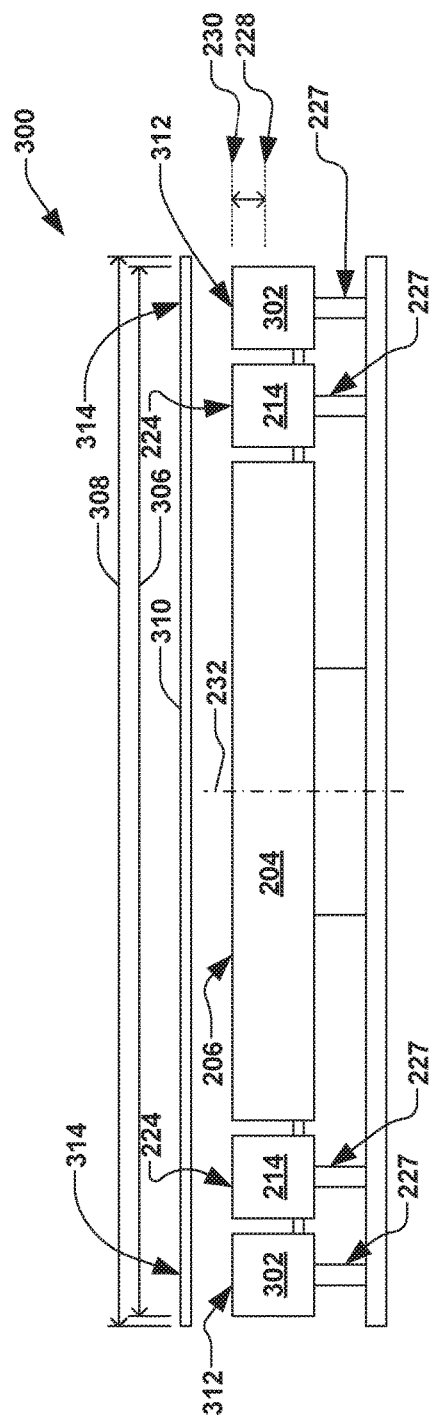
FIG. 5B
FIG. 5C

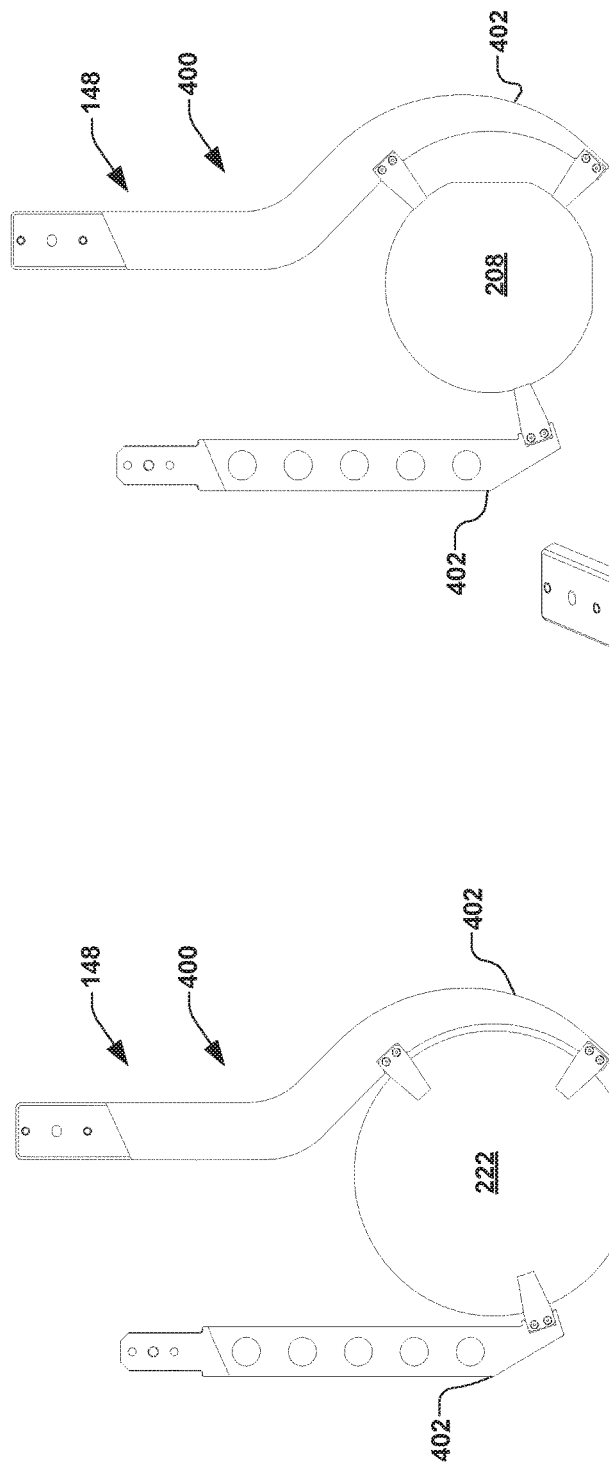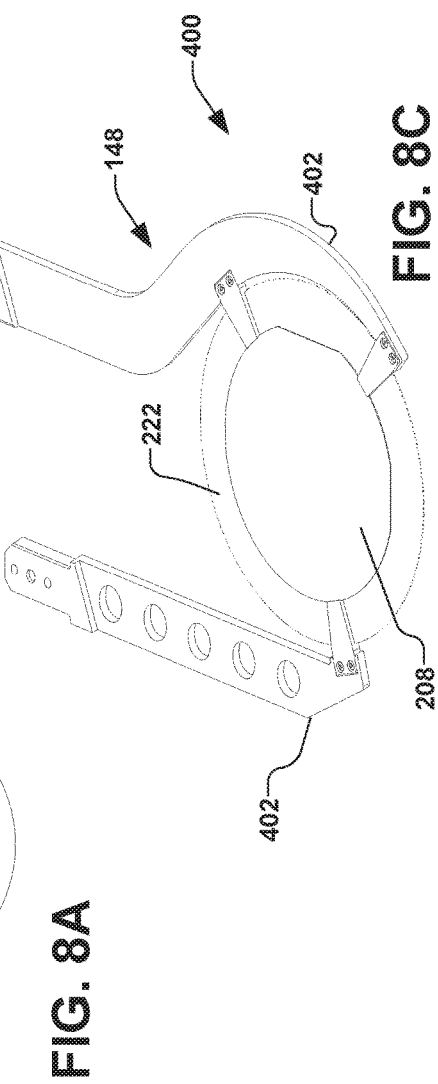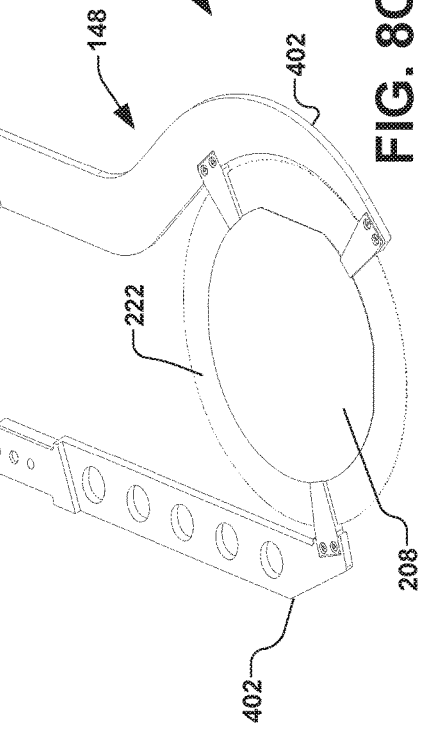
FIG. 8A
FIG. 8B
FIG. 8C

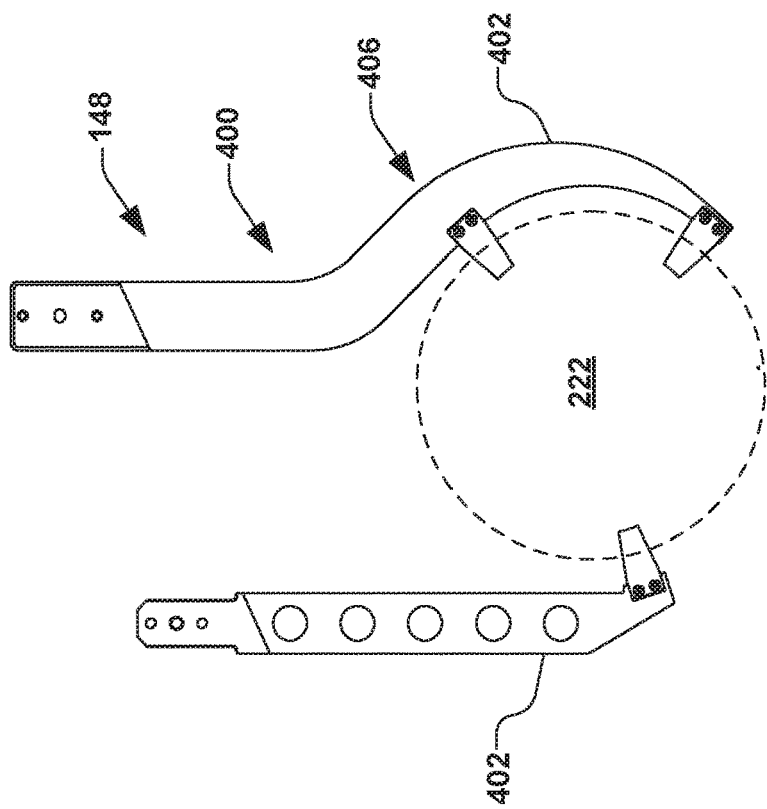
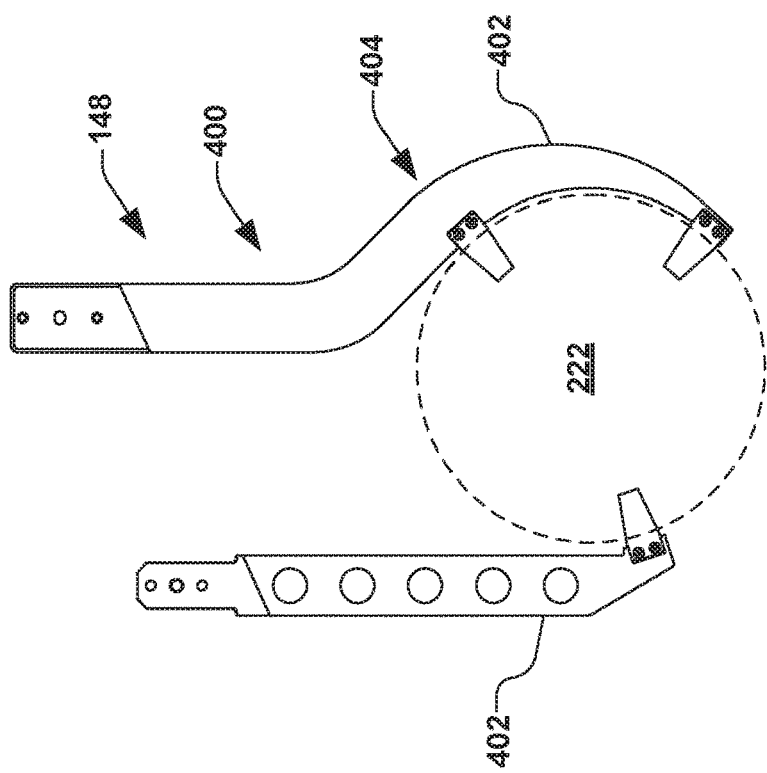

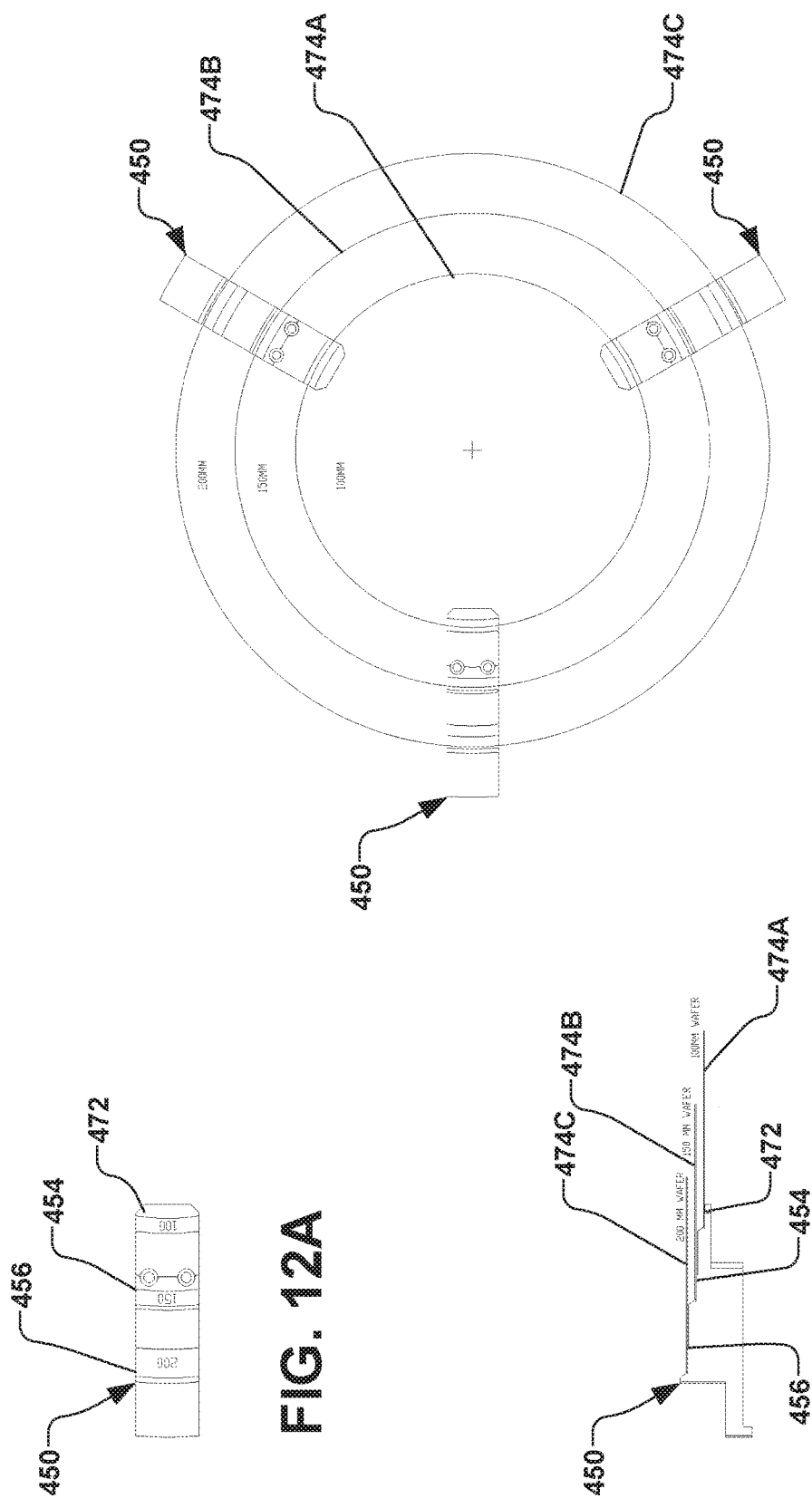

ADJUSTABLE CIRCUMFERENCE ELECTROSTATIC CLAMP

TECHNICAL FIELD

The present invention relates generally to workpiece handling systems, and more specifically to systems and methods for handling workpieces of varying diameters in an ion implantation system.

BACKGROUND

In the semiconductor industry, workpieces such as semiconductor wafers or substrates are often robotically transferred between process steps by workpiece handling systems. Ion implantation systems often utilize a workpiece handling system for transferring workpieces between an atmospheric workpiece carrier and a vacuum process chamber associated with an ion implanter. A conventional workpiece handling system comprises a robot having a gripper coupled thereto, wherein the gripper is configured to selectively grasp an edge of the workpiece.

In a typical ion implantation system, for example, workpiece handling is conventionally fixed for a particular workpiece size, wherein a size of an ion beam impinging on the workpiece accommodates the size of the workpiece. For example, when implanting ions into a 200 mm diameter wafer, a 200 mm wide ion beam is often utilized for implantation. However, if it is desired to implant ions into a 150 mm diameter wafer, various components of the workpiece handling systems and ion implantation system are conventionally modified in order to accommodate the differently-sized workpiece. For example, grippers and electrostatic chucks are typically designed for implanting ions into a single workpiece size. When a workpiece size changes, however, grippers, electrostatic chucks, and/or entire robotic handling components are also conventionally changed.

Thus, conventional ion implantation systems utilize predetermined processing equipment sizes based on the size of the workpiece being implanted, as well as the size of the ion beam impinging thereon. When a differently-sized workpiece is implanted, or a differently-sized ion beam is utilized for the implantation, various changes to the workpiece handling equipment are also made, thus increasing costs and incurring losses to productivity.

SUMMARY

The present invention overcomes the limitations of the prior art by providing a system, apparatus, and method for handling various sized workpieces in an ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In general, an electrostatic chuck is provided for clamping workpieces having differing diameters. In one example, a central electrostatic chuck member is associated with a first workpiece of a first diameter and a first peripheral electrostatic chuck member is associated with a second workpiece of a second diameter that is greater than the first diameter. An elevator translates the first peripheral electrostatic chuck member with respect to central electrostatic chuck member between a retracted position and an extended position. In the retracted position, the first workpiece contacts only the first surface. In the extended position, also called the implant position, the second workpiece contacts the first surface and the second surface. A first peripheral shield generally shields the second surface when the first peripheral electrostatic chuck member is in the retracted position. Additional peripheral electrostatic chuck members and peripheral shields can be added to accommodate additional workpiece diameters.

In accordance with one exemplary aspect, an electrostatic chuck system of the present disclosure comprises a central electrostatic chuck member having first diameter associated with a diameter of the first workpiece, wherein the central electrostatic chuck member is operably coupled to a scan arm base and has a first surface configured to support and the first workpiece. A first peripheral electrostatic chuck member has a first inner diameter associated with the first diameter and a first outer diameter associated with a diameter of the second workpiece. The first peripheral electrostatic chuck member is also operably coupled to the scan arm base and has a second surface configured to support a peripheral region of the second workpiece.

An elevator is configured to translate the first peripheral electrostatic chuck member with respect to central electrostatic chuck member between a retracted position and an extended position along an axis generally perpendicular to the first surface. In the retracted position, the first workpiece contacts only the first surface. In the extended position in the present example, the second workpiece contacts the first surface and the second surface.

Further, a first peripheral shield having a first shield inner diameter associated with the first inner diameter and a first shield outer diameter associated with the first outer diameter is provided. The first peripheral shield, for example, is configured to shield the second surface when the first peripheral electrostatic chuck member is in the retracted position.

In accordance with one example, the central electrostatic chuck is fixed with respect to the scan arm base, and wherein the elevator is configured to translate the first peripheral electrostatic chuck member between the retracted position and the extended position.

In another example, a second peripheral electrostatic chuck member is provided having a second inner diameter associated with the first outer diameter and a second outer diameter associated with a diameter of a third workpiece. The diameter of the third workpiece, for example, is greater than the diameter of the second workpiece, The second peripheral electrostatic chuck member is operably coupled to the scan arm base and has a third surface configured to support a peripheral region of the third workpiece, and the elevator is further configured to translate the second peripheral electrostatic chuck member with respect to the central electrostatic chuck member between the retracted position and the extended position. In the extended position in this example, the third workpiece contacts the first surface, second surface, and third surface.

According to another example, a controller is configured to individually control the retracted and extended position of one or more of the first peripheral electrostatic chuck member second peripheral electrostatic chuck member via a control of the elevator. In another example, a power supply is operably coupled to one or more of the central electrostatic chuck member, first peripheral electrostatic chuck member, and second peripheral electrostatic chuck member. The controller, for example, is thus further configured to selectively energize the central electrostatic chuck member, first peripheral electrostatic chuck member, and second peripheral electrostatic chuck member.

A second peripheral shield having a second inner shield diameter associated with the second inner diameter and a second outer shield diameter associated with the second outer diameter is further provided in another example. The second peripheral shield is configured to shield the third surface when the first peripheral electrostatic chuck member is in the extended position and the second peripheral electrostatic chuck member is in the retracted position. For example, the second outer shield diameter is greater than or equal to the second outer diameter.

One or more of the first peripheral shield and second peripheral shield, for example, comprise a surface comprised of a semiconductor material, such as an aluminum disc coated with silicon. In one example, the first and/or second peripheral shield is comprised of a semiconductor material, such as a semiconductor wafer.

One or more backside gas orifices may be further provided in one or more of the first surface and second surface of the central electrostatic chuck member, first peripheral electrostatic chuck member, second peripheral electrostatic chuck member, etc. A backside gas source is thus configured to provide a backside gas to the one or more backside gas orifices for backside gas cooling or heating of the workpieces being processed. One or more gas distribution passages, for example, are defined in the central electrostatic chuck member and the first peripheral electrostatic chuck member, wherein the one or more of gas distribution passages are in fluid communication with the one or more backside gas orifices.

In accordance with another example, one or more sidewall orifices are defined in a respective sidewall of the central electrostatic chuck member and the first peripheral electrostatic chuck member, wherein the one or more sidewall orifices are in fluid communication the one or more gas distribution passages. A dynamic seal is associated with each of the plurality of the one or more sidewall orifices in another example, wherein the dynamic seal generally permits the translation of the first peripheral electrostatic chuck member with respect to central electrostatic chuck member while preventing a leakage of the backside gas from the one or more sidewall orifices to an external environment.

In another example, the backside gas source is operably coupled to the central electrostatic chuck member, wherein the one or more of gas distribution passages provide the backside gas to at least the first peripheral electrostatic chuck member through the one or more sidewall orifices.

According to yet another example, one or more transfer apparatuses configured to selectively transfer the first workpiece, second workpiece, and first peripheral shield to and from the first surface and second surface. In a further example, an ion implantation system is further provided, wherein a size of the ion beam is configurable to implant any size of workpiece clamped on the electrostatic chuck.

In accordance with another exemplary aspect of the disclosure, a method for implanting ions into a first workpiece and a second workpiece of differing diameters is provided. For example, the first peripheral shield is placed on the second surface of the first peripheral electrostatic chuck member when it is desired to implant ions into the first workpiece. The first peripheral electrostatic chuck member is retracted with respect to the central electrostatic chuck member, wherein the second surface is recessed from the first surface, and the first workpiece is placed on the first surface of the central electrostatic chuck member. Accordingly, ions are implanted into the first workpiece by passing an ion beam relative to the first workpiece.

The first workpiece is removed from the central electrostatic chuck member, and the first peripheral electrostatic chuck member is raised with respect to the central electrostatic chuck member when it is desired to implant ions into the second workpiece. Accordingly, the second surface is generally co-planar with the first surface. The first peripheral shield is removed from the second surface of the first peripheral electrostatic chuck member, and the second workpiece is placed on the first surface of the central electrostatic chuck member and the second surface of the first peripheral electrostatic chuck member and implanted with ions. When the implant is complete, the second workpiece is removed from the central electrostatic chuck member and first peripheral electrostatic chuck member.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 2A-2B illustrate perspective views of respective first and second workpieces positioned on an exemplary chuck system according to various aspects of the disclosure.

FIGS. 3A-3B illustrate cross-sectional side views respective first and second workpieces positioned on an exemplary chuck system according to various aspects of the disclosure.

FIGS. 5A-5C illustrate cross-sectional side views respective first, second, and third workpieces positioned on an exemplary chuck system according to various aspects of the disclosure.

FIGS. 8A-8B illustrate plan views of an exemplary gripper mechanism with respective second and first workpieces gripped therein in accordance with various aspects of the disclosure.

FIG. 8C illustrates a perspective view of the exemplary gripper mechanism of FIGS. 8A-8B.

FIGS. 9A-9B illustrate plan views of an exemplary gripper mechanism in a respective grip position and release position, in accordance with various aspects of the disclosure.

FIG. 12A is a plan view of an exemplary support member for supporting three different-sized workpieces in accordance with various aspects of the disclosure.

FIG. 12B is a side view of the exemplary support member of FIG. 12A supporting respective first, second, and third workpieces in accordance with various aspects of the disclosure.

FIG. 12C is a plan view of a plurality of support members supporting respective first, second, and third workpieces in accordance with various aspects of the disclosure.

DETAILED DESCRIPTION

Figure 1:
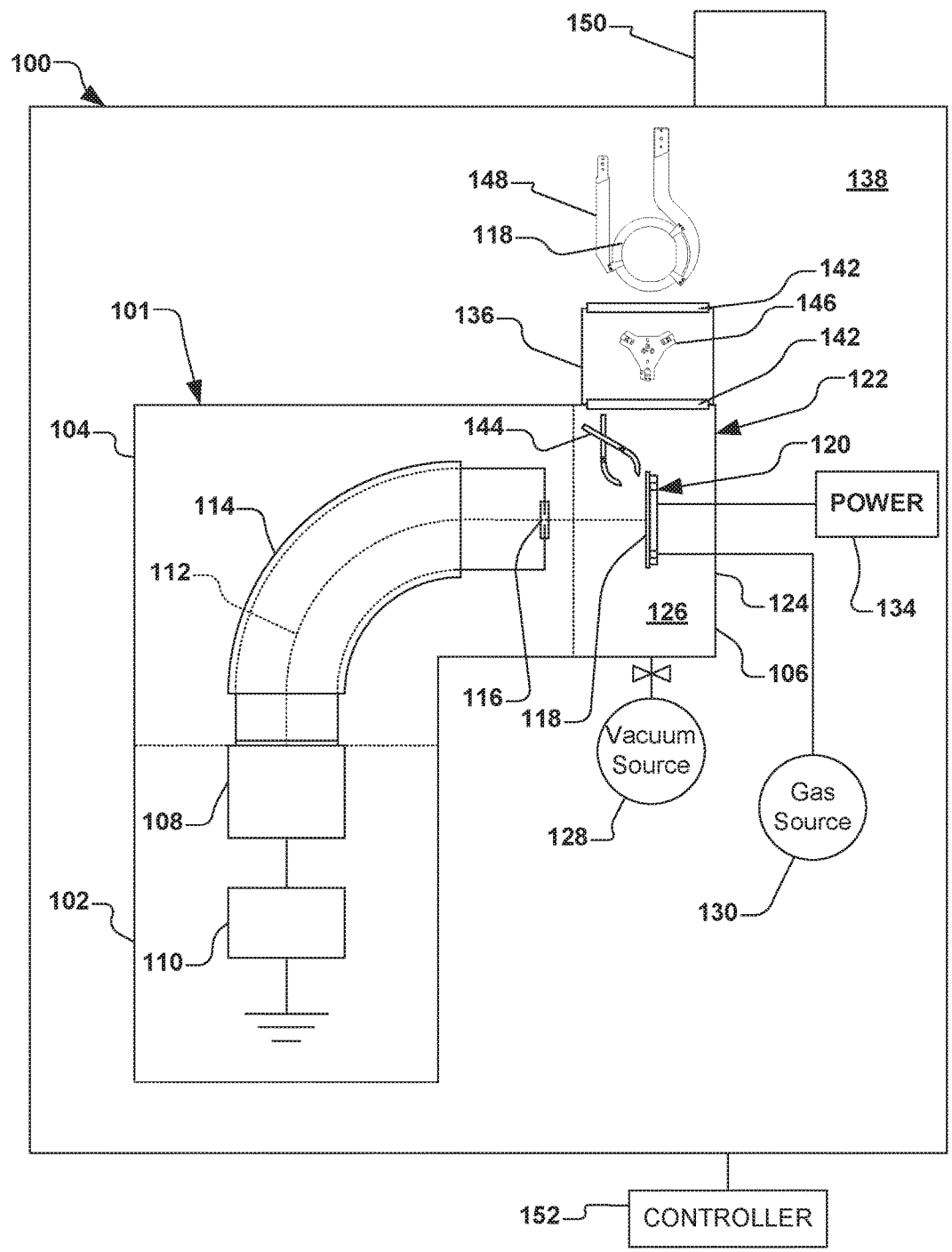
FIG. 1 is a block diagram of an exemplary ion implantation system in accordance with several aspects of the present disclosure.

The present disclosure is directed generally toward a system, apparatus, and method for clamping workpieces of various diameters in an ion implantation system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessary to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 system (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During an implantation utilizing the ion implantation system 101, energy can build up on the workpiece 118 in the form of heat, as the charged ions collide with the workpiece. Absent countermeasures, such heat can potentially warp or crack the workpiece 118, which may render the workpiece worthless (or significantly less valuable) in some implementations. Other undesirable effects could also occur from the undesirable heating of the workpiece 118.

Thus, in accordance with another example, the chuck system 120 comprises a backside gas source 130, wherein the backside gas source 130 is configured to provide backside gas 132 to the backside of the workpiece 118 within the process chamber 122 during the exposure of the workpiece to the ion beam 112. In one example, the backside gas comprises an inert gas, such as dry nitrogen. As such, the backside gas source 130 providing the backside gas may comprise pressure tanks or vessels (not shown) for holding/storing the backside gas. According to another example, a power supply 134 is provided, wherein the power supply is operably coupled to the chuck system 120 for electrostatic clamping of the workpiece 118 to the chuck system. The chuck system 120 will be discussed in greater detail infra.

In accordance with another aspect, a load lock chamber 136 is further operably coupled to the process chamber 122, wherein the load lock chamber is configured to isolate the process environment 126 from an external environment 138. The load lock chamber 136 further comprises a workpiece support 140 configured to support the workpiece 118 during a transfer of the workpiece between the process chamber 122 and the external environment 138. A plurality of load lock doors 142 operably couple the load lock chamber 136 to the respective process chamber 122 and the external environment 138. Accordingly, the load lock chamber 136 maintains the process environment 126 (e.g., a dry, vacuum environment) within the vacuum system 100 via a variation in of the load lock chamber environment. A pressure within the load lock chamber 136, for example, is configured to vary between the vacuum associated with the process environment 126 and an external pressure (e.g., atmospheric pressure) associated with the external environment 138. Accordingly, the load lock chamber 136 permits a transfer of the workpiece 118 into and out of the ion implantation system 101 without compromising the quality of vacuum (e.g., the process environment 126) within the ion implantation system.

In one example, as will be discussed in greater detail hereafter, a vacuum transfer apparatus 144 (e.g., a vacuum robot) is provided, wherein the vacuum transfer apparatus is configured to transfer the workpiece 118 between a load lock support 146 within the load lock chamber 136 and the chuck system 120. In yet another example, an atmospheric transfer apparatus 148 (e.g., an atmospheric robot) is configured to transfer the workpiece 118 between a workpiece transport container 150 (e.g., a FOUP—) and the load lock support 146 within the load lock chamber 136. For example, the atmospheric transfer apparatus 146 is configured to remove and/or return the workpiece 118 from and/or to the workpiece transport container 150. The vacuum transfer apparatus 144 and atmospheric transfer apparatus 148 will also be discussed in more detail infra.

According to another example, a controller 152 is provided, wherein the controller is configured to control one or more components of the vacuum system 100, such as the ion implantation system 101, chuck system 120, vacuum source 128, backside gas source 130, power supply 134, vacuum transfer apparatus 144, atmospheric transfer apparatus 148, as well as other components within the vacuum system. It should be understood that while one controller 152 is described herein, control of the various components within the vacuum system 100 can be achieved utilizing separate or multiple controllers, and all are considered to fall within the scope of the present disclosure.

Referring generally to FIGS. 2A-2B, 3A-3B, 4, an exemplary chuck system 200 will now be discussed in greater detail in accordance with another exemplary aspect of the disclosure. It will be appreciated that the chuck system 120 of FIG. 1 and chuck system 200 (also called an electrostatic chuck system) may be implemented in the vacuum system 100 of FIG. 1 in order to efficiently process multiple-sized workpieces 118. For example, the chuck systems 120, 200 described hereafter have particular use in processing workpieces 118 having multiple diameters, such as 100 mm, 150 mm, 200 mm, and 300 mm, among others. While specific sizes of workpieces 118 are described herein, it should be noted that the present disclosure is not limited to particular sizes of workpieces, and various alterations of the present disclosure can easily be made to process larger and/or smaller-sized workpieces, and all such alterations are contemplated as falling within the scope of the present disclosure.

As can be seen in FIGS. 2A-2B, for example, the chuck system 200 comprises a base 202 operable coupled to a scan arm 203, wherein the scan arm is configured to selectively scan the base through the ion beam 112 of FIG. 1 in various manners known to one of ordinary skill in the art, and which will not be further detailed, herein. According to one example, a central electrostatic chuck member 204 of FIG. 3A is operably coupled to the base 202, wherein the central electrostatic chuck member has a central chuck surface 206 configured to support and electrostatically clamp at least a first workpiece 208 thereto. The central electrostatic chuck member 204, for example, has a first central diameter 210 associated with a diameter 212 of the first workpiece 208. For example, the first central diameter 210 is slightly smaller (e.g., 2 mm) than the diameter 212 of the first workpiece 208.

In accordance with one example, a first peripheral electrostatic chuck member 214 is further provided, wherein the first peripheral electrostatic chuck member is further operably coupled to the base 202. The first peripheral electrostatic chuck member 214, for example, generally surrounds the central electrostatic chuck member 204. In the present example, the first peripheral electrostatic chuck member 214 has a first inner diameter 216 associated with the first central diameter 210 and a first outer diameter 218 associated with a diameter 220 of a second workpiece 222, as illustrated in FIG. 3B. The diameter 220 of the second workpiece 222, for example, is greater than the diameter 212 of the first workpiece 208 of FIG. 3A. For example, the diameter 220 of the second workpiece 222 is 150 mm, while the diameter 212 of the first workpiece 208 is 100 mm.

The first peripheral electrostatic chuck member 214, for example, is further operably coupled to the base 202 and has a first peripheral chuck surface 224 configured to support at least a peripheral region 226 of the second workpiece 222, as illustrated in FIG. 3B. In one example, the first peripheral electrostatic chuck member 214 is configured to electrostatically clamp the peripheral region 226 of at least the second workpiece 222 thereto.

An elevator 227, for example, is further provided and configured to selectively translate the first peripheral electrostatic chuck member 214 with respect to central electrostatic chuck member 204 between a retracted position 228 shown in FIG. 3A and an extended position 230 (also called an implant position) shown in FIG. 3B along an axis 232 that is generally perpendicular (e.g., orthogonal) to at least the central chuck surface 206. The first peripheral chuck surface 224, for example, generally resides below the central chuck surface 206 when at the retracted position 228 of FIG. 3A, and is generally co-planar with the central chuck surface 206 when at the extended position of FIG. 3B.

Accordingly, in the retracted position 228 of the example illustrated in FIG. 3A, the first workpiece 208 contacts only the central chuck surface 206, and in the extended position 230 of the example illustrated in FIG. 3B, the second workpiece 222 contacts both the central chuck surface 206 and the first peripheral chuck surface 224. As such, the elevator 227 is operable to translate the first peripheral electrostatic chuck member 214 such that the first workpiece 208 or the second workpiece 222 can be individually accommodated and clamped to the chuck system 200, as will be discussed further infra.

In accordance with another exemplary aspect, a first peripheral shield 234 is further provided and illustrated in FIG. 3A, wherein the first peripheral shield is configured selectively cover the first peripheral chuck surface 224 when the first peripheral electrostatic chuck member 214 is at the retracted position 228. The first peripheral shield 234, for example, has a first shield inner diameter 236 associated with (e.g., spaced apart from) the first inner diameter 216 of the first peripheral electrostatic chuck member 214. The first peripheral shield 234, for example, further has a first shield outer diameter 238 associated with the first outer diameter 218 of the first peripheral electrostatic chuck member 214 of FIG. 3B. Accordingly, the first peripheral shield 234, in one example, is configured to shield the first peripheral chuck surface 224 from the ion beam 112 of FIG. 1 when the first peripheral electrostatic chuck member 214 is in the retracted position 228 of FIG. 3A (e.g., when the chuck system 200 is clamping the first workpiece 208).

The first peripheral shield is 234, for example, comprises a metal disc (e.g., aluminum) that is coated with a semiconductor material (e.g., silicon). Alternatively, the first peripheral shield is 234 comprises or is comprised of a semiconductor material similar to that being processed in the ion implantation system 101 of FIG. 1, such as a silicon wafer. As such, the semiconductor material absorbs ions from the ion beam 112 in a manner similar to that of the workpiece, thus minimizing unwanted contamination from sputtered material within the process chamber 122.

In another example, the central electrostatic chuck member 204 of FIGS. 3A and 3B is generally fixed with respect to the base 202 along the axis 232, wherein the elevator 227 is configured to translate the first peripheral electrostatic chuck member 214 between the retracted position 228 of FIG. 3A and the extended position 230 of FIG. 3B. Alternatively, the central electrostatic chuck member 204 is also permitted to travel with respect to the scan arm base 202 along the axis 232, and wherein the elevator 227 is further configured to translate the central electrostatic chuck member.

The chuck system 200, for example, may be controlled by the controller 152 of FIG. 1, wherein the position (e.g., the retracted position 228 of FIG. 3A and the extended position 230 of FIG. 3B) of the first peripheral electrostatic chuck member 214 with respect to the central electrostatic chuck member 204 is controlled via a control of the elevator 227. Furthermore, in accordance with another exemplary aspect, the power supply 134 of FIG. 1 is further operably coupled to the central electrostatic chuck member 204 and first peripheral electrostatic chuck member 214 of FIGS. 3A and 3B, wherein the controller 152 is further configured to selectively energize the central electrostatic chuck member and first peripheral electrostatic chuck member to selectively clamp the respective the first workpiece 208, second workpiece 222, and first peripheral shield 234 to the respective central electrostatic chuck member and first peripheral electrostatic chuck member. In one example, the controller 152 is configured to individually and/or concurrently energize the central electrostatic chuck member 204 and first peripheral electrostatic chuck member 214.

Alternatively, multiple controllers 152 and power supplies 134 may be implemented for control of the chuck system 200, and are contemplated as falling within the scope of the present disclosure.

Figure 4:
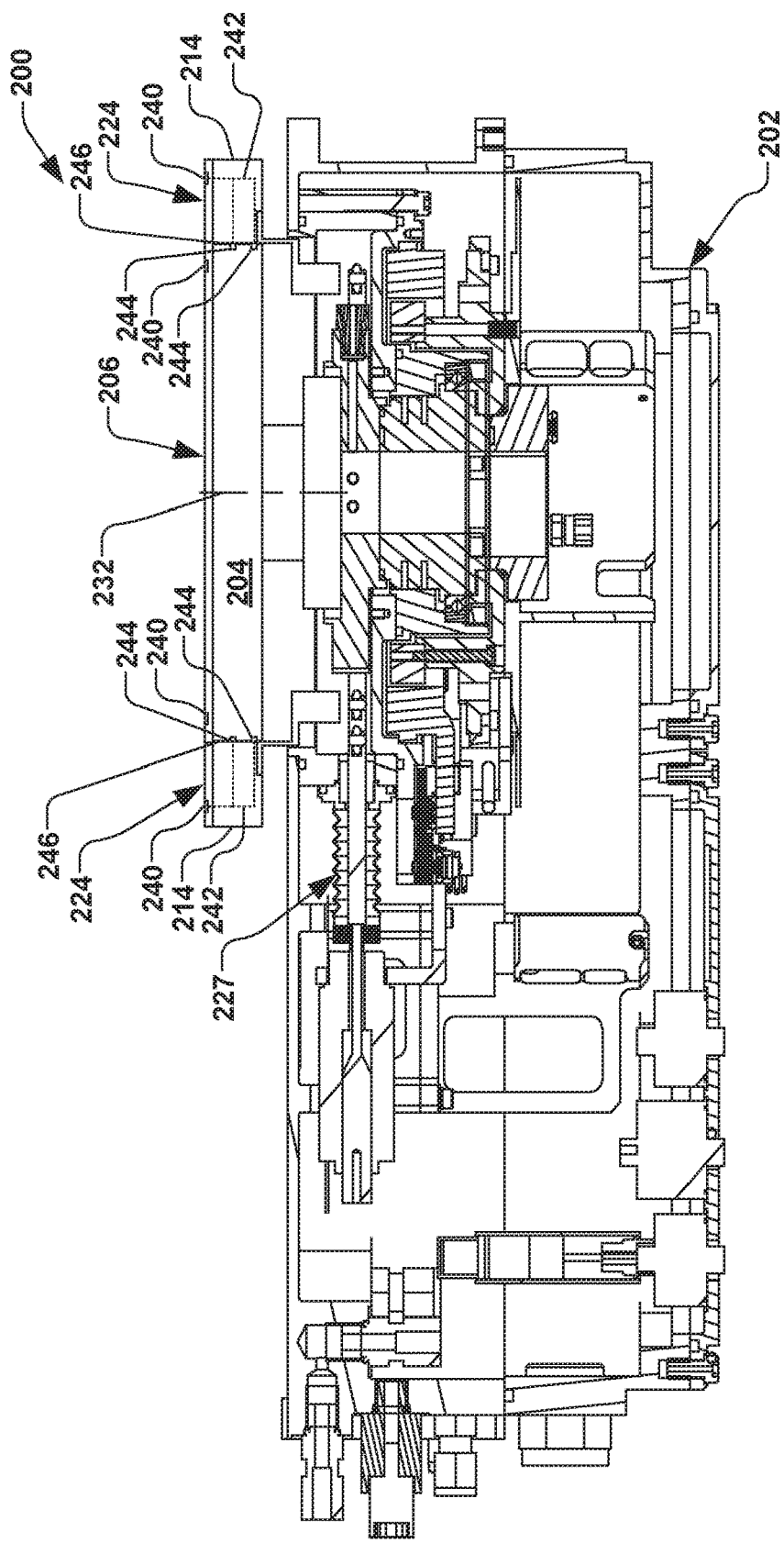
FIG. 4 illustrates a cross-sectional side view of an exemplary chuck system mounted to a scan arm according to various aspects of the disclosure.

In accordance with yet another example, in a more detailed view illustrated in FIG. 4, one or more backside gas orifices 240 are further provided in one or more of the central chuck surface 206 and the first peripheral chuck surface 224, wherein the backside gas source 130 of FIG. 1 is configured to provide a backside gas to the one or more backside gas orifices for backside cooling of the respective first workpiece 208, second workpiece 222, and first peripheral shield 234 of FIGS. 3A-3B. One or more gas distribution passages 242 illustrated in FIG. 4 may be further defined in the central electrostatic chuck member 204 and the first peripheral electrostatic chuck member 214, wherein the one or more of gas distribution passages are in fluid communication with the one or more backside gas orifices 240.

For example, one or more sidewall orifices 244 may be defined in a respective sidewall 246 of the central electrostatic chuck member 204 and the first peripheral electrostatic chuck member 214, wherein the one or more sidewall orifices are in selective fluid communication with the one or more gas distribution passages 242 associated with the respective one or more backside gas orifices 240, based on the position (e.g., the retracted position 228 of FIG. 3A and the extended position 230 of FIG. 3B) of the first peripheral electrostatic chuck member with respect to the central electrostatic chuck member. For example, a dynamic seal (not shown) may be associated with each of the one or more sidewall orifices 244, wherein the dynamic seal generally permits the translation of the first peripheral electrostatic chuck member 214 with respect to central electrostatic chuck member 204 while preventing a leakage of the backside gas from the one or more sidewall orifices to the process chamber environment 126 of FIG. 1.

The backside gas source 130 of FIG. 1, for example, may be operably coupled to the central electrostatic chuck member 204 of FIG. 4, wherein the one or more of gas distribution passages 242 selectively provide the backside gas to the one or more of the central electrostatic chuck member 204 and first peripheral electrostatic chuck member 214 through the one or more sidewall orifices. A solenoid valve or other device (not shown) may be further provided to selectively fluidly couple the respective one or more sidewall orifices 244 to the gas source 130 of FIG. 1.

Figure 5A:
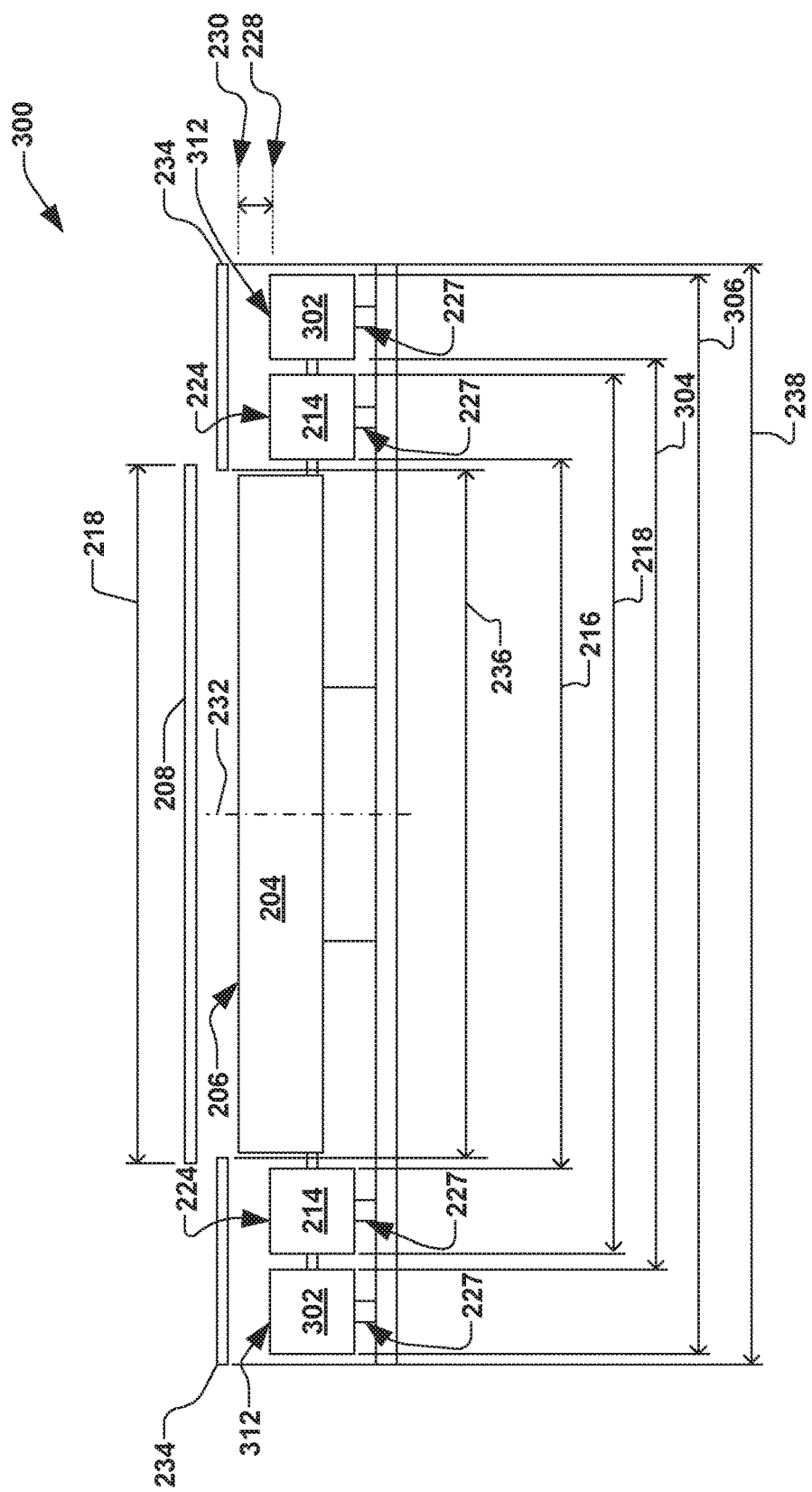

In accordance with yet another exemplary aspect of the disclosure, as illustrated in FIGS. 5A-5C, another electrostatic chuck system 300 is illustrated that is similar to the chuck system 200 of FIGS. 4A-4B, with the addition of a second peripheral electrostatic chuck member 302 that operably coupled to the base 202. The second peripheral electrostatic chuck member 302, for example, has a second inner diameter 304 associated with (e.g., spaced apart from) the first outer diameter 218 of the first peripheral electrostatic chuck member 214. The second peripheral electrostatic chuck member 302, for example, further has a second outer diameter 306 associated with a diameter 308 of a third workpiece 310, as illustrated in FIG. 5C. As illustrated, the diameter 308 of the third workpiece 310 is greater than the diameter 220 of the second workpiece 222 of FIG. 5B, which in turn, is further greater than the diameter 218 of the first workpiece 208 of FIG. 5A. Accordingly, the second peripheral electrostatic chuck member 302 generally surrounds the first peripheral electrostatic chuck member 214 and has a second peripheral chuck surface 312 configured to support a peripheral region 314 of the third workpiece 310 of FIG. 5C. The second peripheral electrostatic chuck member 302, for example, is further configured to selectively electrostatically attract the peripheral region 314 of the third workpiece 310 thereto.

The elevator 227, for example, is further configured to translate the second peripheral electrostatic chuck member 302 with respect to the central electrostatic chuck member 204 along the axis 232 between the retracted position 228 and the extended position 230. The second peripheral chuck surface 312, for example, is generally co-planar with the central chuck surface 206 when at the extended position 230 of FIG. 5C, and wherein the second peripheral chuck surface resides below the central chuck surface when at the retracted position 228 of FIGS. 5A-5B. In the extended position 230 illustrated in FIG. 5C, for example, the third workpiece 310 may contact the central chuck surface 206, first peripheral chuck surface 224, and second peripheral chuck surface 312.

Similar to that discussed above, the controller 152 of FIG. 1 may be further configured to individually control the retracted position 228 and extended position 230 of the first peripheral electrostatic chuck member 214 and second peripheral electrostatic chuck member 302 via a control of the elevator 227. The elevator 227, for example, may comprise individually controlled elevators operably coupled the first peripheral electrostatic chuck member 214 and second peripheral electrostatic chuck member 302 for individual control of the associated extended position 230 and retracted position 228. Further, the power supply 134 may be operably coupled to the central electrostatic chuck member 204, first peripheral electrostatic chuck member 214 and second peripheral electrostatic chuck member 302, wherein the controller 152 is further configured to selectively energize the central electrostatic chuck member, first peripheral electrostatic chuck member, and second peripheral electrostatic chuck member. In one example, the controller 152 of FIG. 1 is configured to individually and/or concurrently energize the central electrostatic chuck member 204, first peripheral electrostatic chuck member 214, and second peripheral electrostatic chuck member 302 of FIGS. 5A-5C.

According to yet another example, a second peripheral shield 316 is provided in FIG. 5B, wherein the second peripheral shield is configured selectively cover or shield the second peripheral chuck surface 312 when the first peripheral electrostatic chuck member 214 is at the extended position 230 and the second peripheral chuck member 302 is at the retracted position 228, as illustrated in FIG. 5B. The second peripheral shield 316, for example, may be formed of similar materials to that of the first peripheral shield 234.

Accordingly, in the example illustrated in FIG. 5A, the first shield inner diameter 236 of the first peripheral shield 234 is associated with the first inner diameter 216 of the first peripheral electrostatic chuck member 214. The first shield inner diameter 236, for example, is associated with the first diameter 218 of the first workpiece 208. Further, in the example of FIG. 5A, the first shield outer diameter 238 of the first peripheral shield 234 is associated with the second outer diameter 306 of the second peripheral electrostatic chuck member 214. For example, the first shield outer diameter 238 is associated with the diameter 308 of the third workpiece 310 of FIG. 5C.

Furthermore, the second peripheral shield 316 of FIG. 5B, for example, has a second shield inner diameter 318 associated with the first outer diameter 218 of the first peripheral electrostatic chuck member 214 of FIG. 5A. The second shield inner diameter 318 of FIG. 5B, for example, is associated with the second diameter 220 of the second workpiece 222. Further, the second peripheral shield 316 has a second shield outer diameter 320 associated with the second outer diameter 306 of the second peripheral electrostatic chuck member 214. Accordingly, any number and size of peripheral shields may be utilized in accordance with any number and size of peripheral electrostatic chuck members, based on the desired number and sizes of workpieces to be supported and clamped. Thus, the present disclosure provides various options and configurations for selectively clamping various-sized workpieces, while shielding portions of the clamping surface that are not covered by a workpiece.

In accordance with yet another exemplary aspect of the disclosure, one or more transfer apparatuses are further provided and configured to selectively transfer at least the first workpiece 208, second workpiece 222, and first peripheral shield 234 to and the central chuck surface 206 and first peripheral chuck surface 224 of FIGS. 3A-3B. For example, the vacuum transfer apparatus 144 of FIG. 1 is configured to transfer the first workpiece 208 and second workpiece 222 of FIGS. 3A-3B between the load lock support 146 and the chuck system 200. In yet another example, the vacuum transfer apparatus 144 of FIG. 1 is further configured to transfer the first peripheral shield 234 of FIGS. 3A-3B between the first peripheral chuck surface 224 and a storage location (not shown), such as within the process chamber 122 or the load lock chamber 136.

Figure 6A:
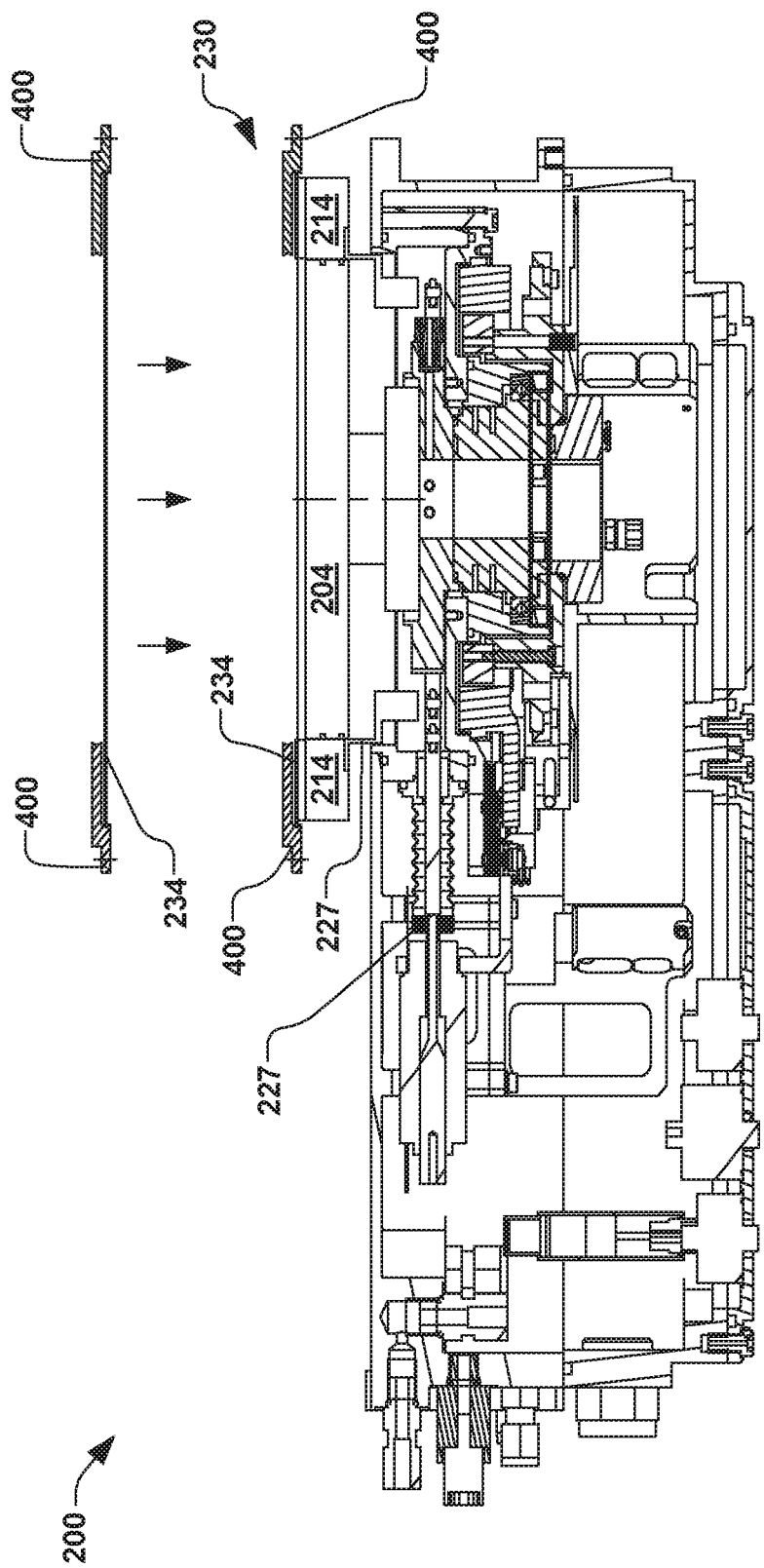
FIGS. 6A-6C illustrate cross-sectional side views of an exemplary chuck system associated with processing of a first workpiece, according to various aspects of the disclosure.
Figure 6B:
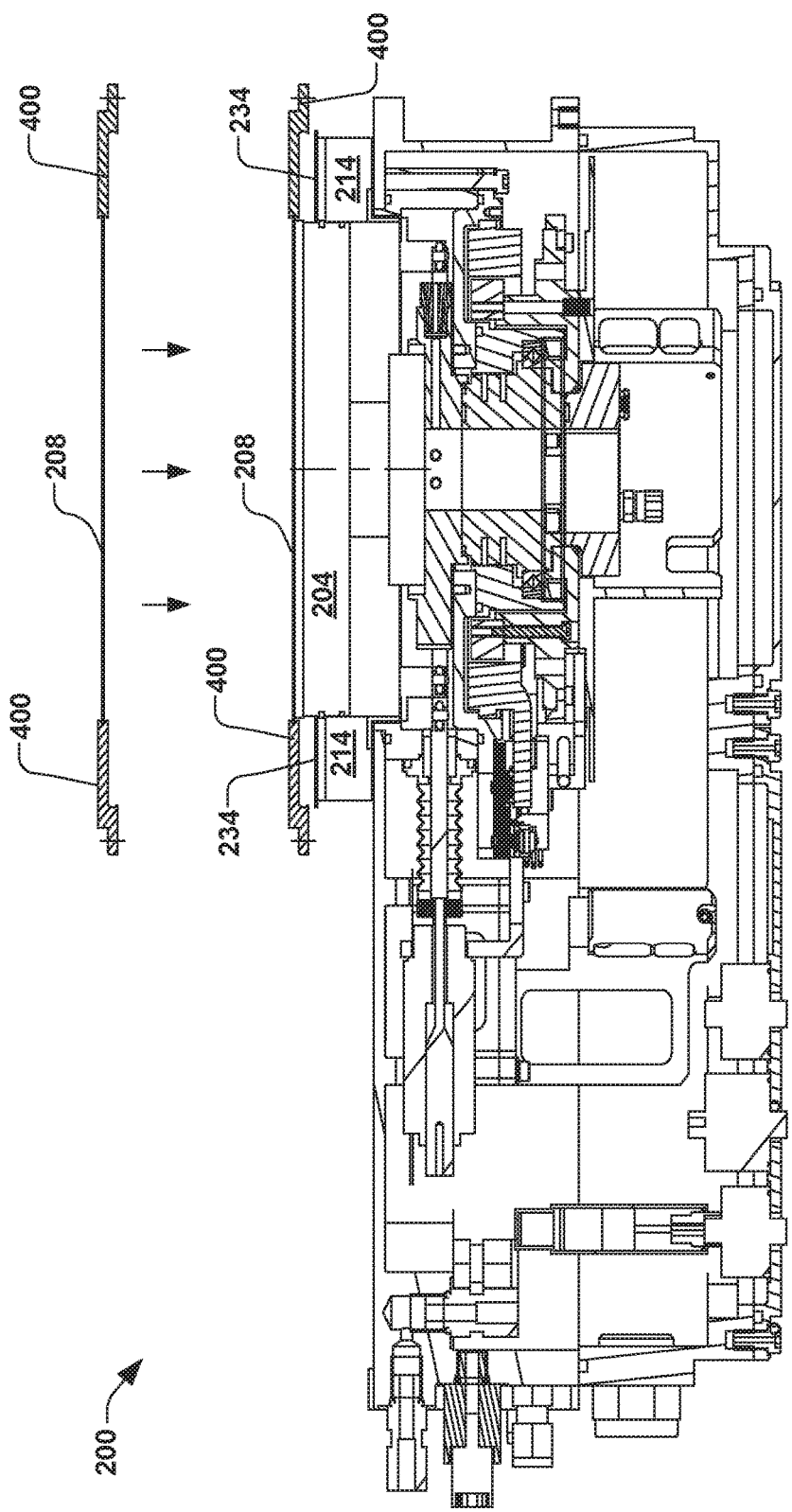
Figure 6C:
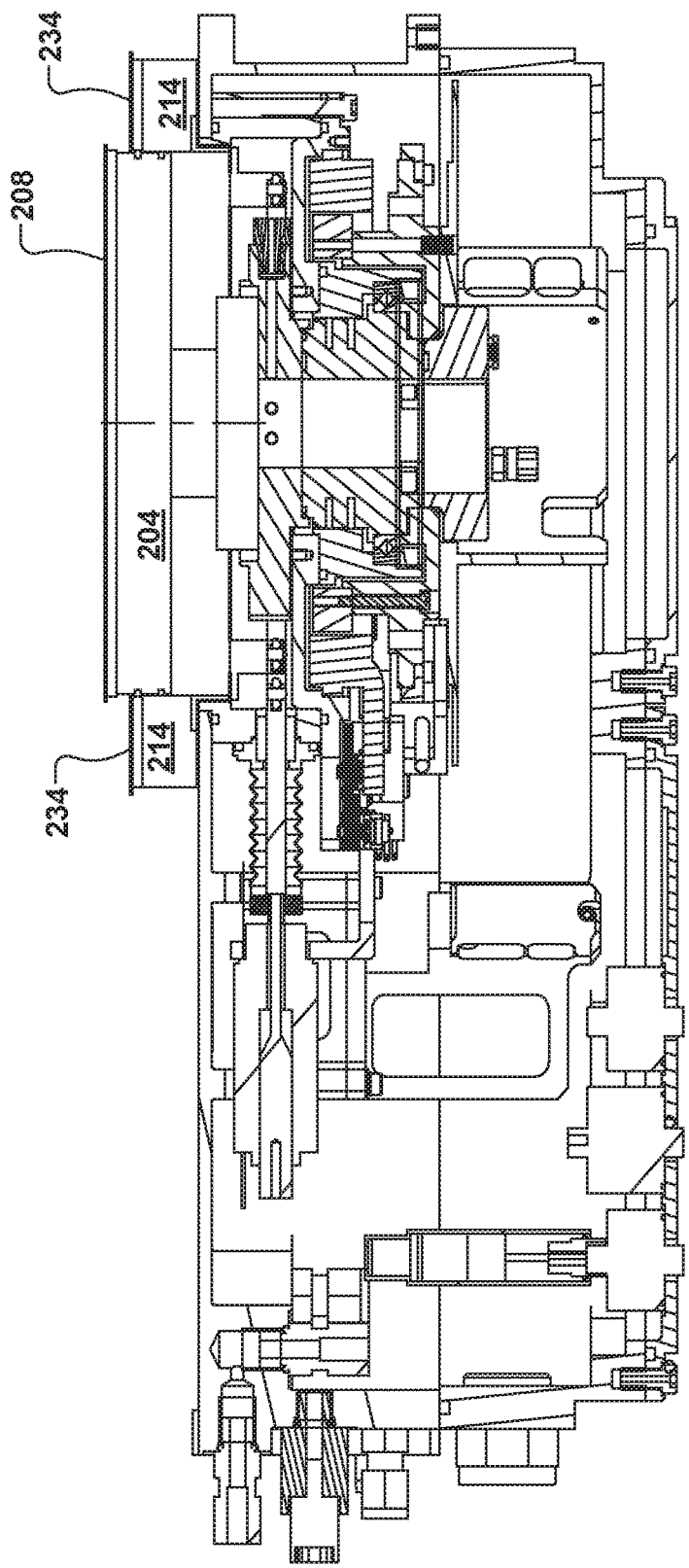

FIGS. 6A-6C, for example, illustrate a first workpiece 208 and first peripheral shield 234 being placed on the respective central electrostatic chuck member 204 and first peripheral electrostatic chuck member 214 via an exemplary gripper mechanism 400. For example, in FIG. 6A, the first peripheral shield 214 is first placed (illustrated by arrows) on the first peripheral electrostatic chuck member 214 via the gripper mechanism 400 when the central electrostatic chuck member 204 and first peripheral electrostatic chuck member 214 are both in the extended position 230. In FIG. 6B, the first peripheral electrostatic chuck member 214 is placed in the retracted position 228, and the first workpiece 208 is further placed (illustrated by arrows) on the central electrostatic chuck member 204 via the gripper mechanism 400. FIG. 6C illustrates the first workpiece 208 and first peripheral shield 214 in place, wherein the chuck system 200 is ready for ion implantation or other processing.

Figure 7A:
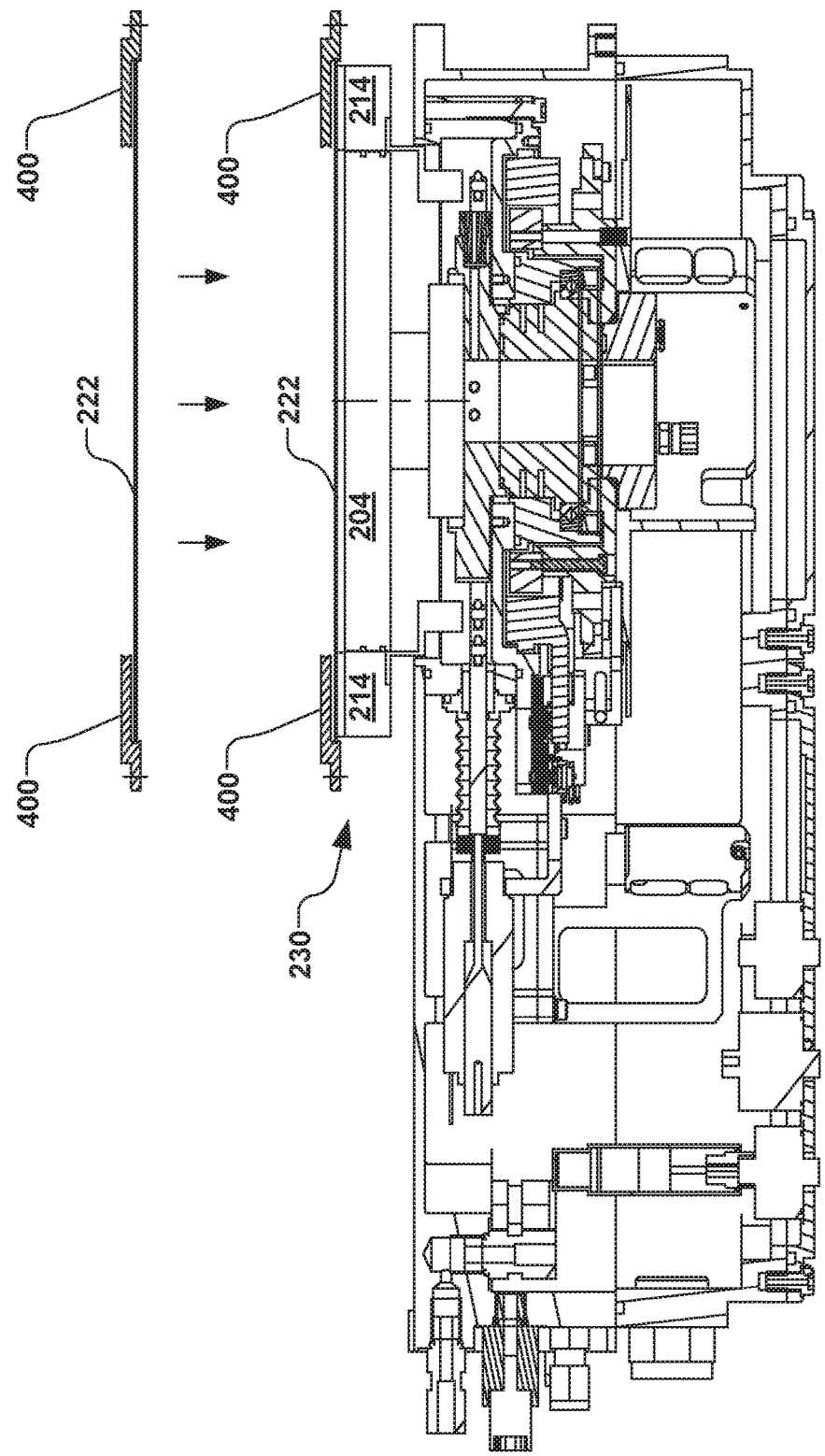
FIGS. 7A-7B illustrate cross-sectional side views of an exemplary chuck system associated with processing of a second workpiece, according to various aspects of the disclosure.
Figure 7B:
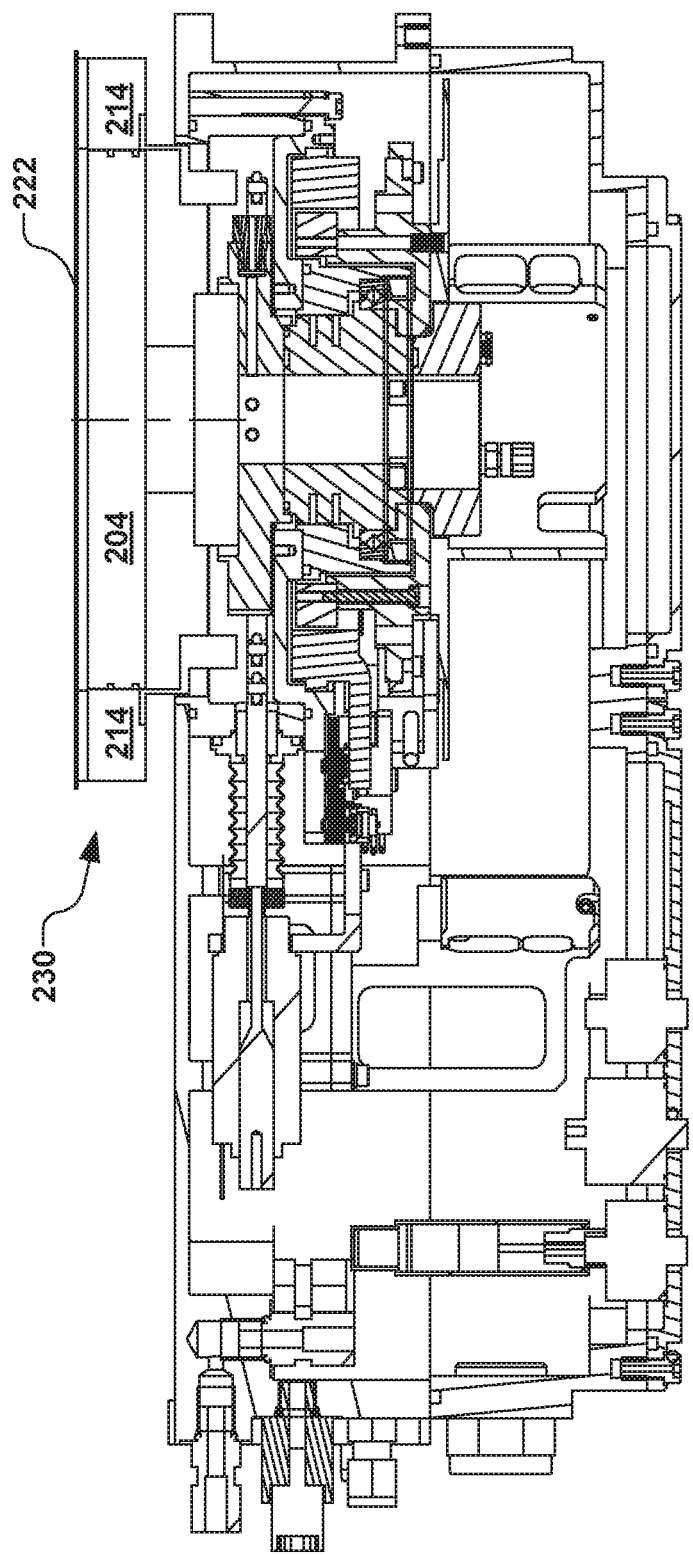

FIGS. 7A-7B, for example, illustrate a second workpiece 222 being placed on the respective central electrostatic chuck member 204 and first peripheral electrostatic chuck member 214 via the exemplary gripper mechanism 400. For example, in FIG. 7A, the second workpiece 222 is first placed (illustrated by arrows) on the central electrostatic chuck member 204 and first peripheral electrostatic chuck member 214 via the gripper mechanism 400 when the central electrostatic chuck member 204 and first peripheral electrostatic chuck member 214 are both in the extended position 230. FIG. 7B thus illustrates the second workpiece 222 in place, wherein the chuck system 200 is ready for ion implantation or other processing.

In accordance with another aspect of the disclosure, the gripper mechanism 400 of FIGS. 6A-6C and 7A-7B is further illustrated in FIGS. 8A-8C for individually gripping a plurality of workpieces of differing sizes. The gripper mechanism 400, for example, comprises a plurality of gripper arms 402 (e.g., two gripper arms) configured to translate between a grip position 404 and a release position 406, as illustrated in FIGS. 9A and 9B, respectively. The plurality of gripper arms 402, for example, may linearly translate with respect to one another, or rotate about an axis (not shown).

As illustrated in FIGS. 8A-8C, the gripper mechanism 400 further comprises a plurality of guides 408 operably coupled to the plurality of gripper arms 402, wherein a first gripping portion 410 of each of the plurality of guides is associated with the diameter of the first workpiece 208 when the plurality of gripper arms are in the grip position 404. Accordingly, the first gripping portion 410 (e.g., a notch) of the plurality of guides 408 is configured to selectively grip the first workpiece 208 therebetween when the plurality of gripper arms 402 are in the grip position 404, as illustrated in FIG. 8A. A second gripping portion 412 is provided on each of the plurality of guides 408, for example, and is associated with the diameter of the second workpiece 222 when the plurality of gripper arms 402 are in the grip position 404, as illustrated in FIG. 8B. Accordingly, the second gripping portion 412 of the plurality of guides 408 are configured to selectively grip the second workpiece 222 when the plurality of gripper arms 402 are in the grip position 404. Further, the first gripping portion 410 and second gripping portion 412 of the plurality of guides 408 are configured to selectively release the respective first workpiece 208 and second workpiece 222 when the plurality of gripper arms are in the release position 406 of FIG. 9B.

Figure 10:
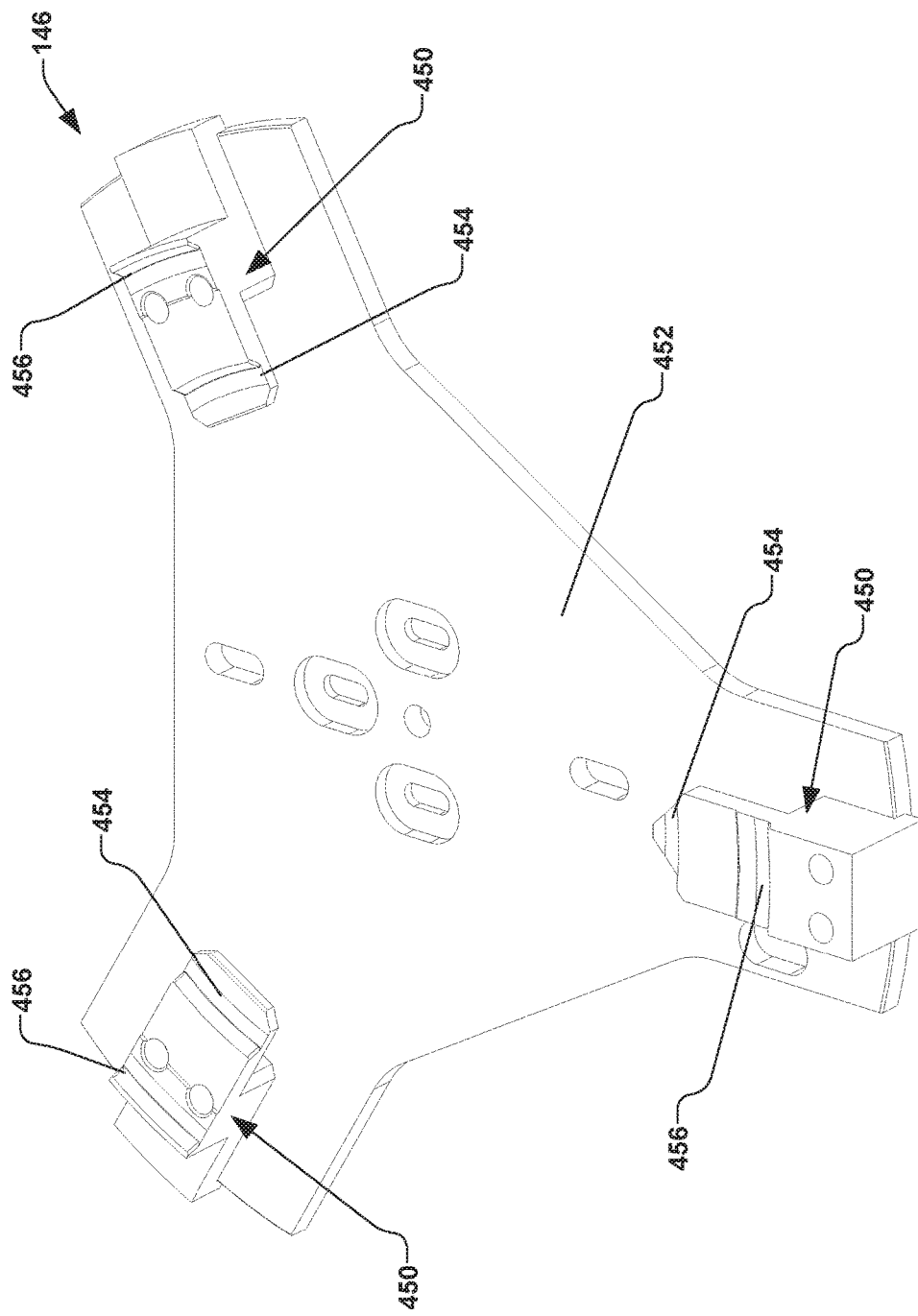
FIG. 10 illustrates a perspective view of an exemplary load lock support in accordance with various aspects of the disclosure.
Figure 11A:
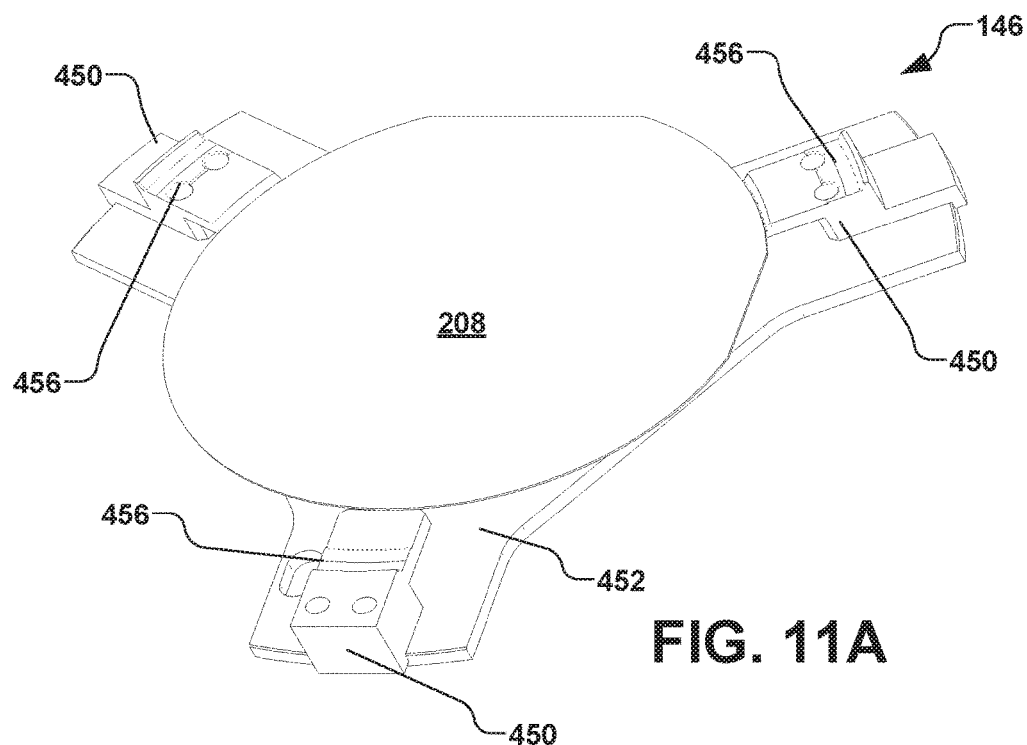
FIGS. 11A-11B illustrate plan views of an exemplary load lock support supporting respective first and second workpieces in accordance with various aspects of the disclosure.
Figure 11B:
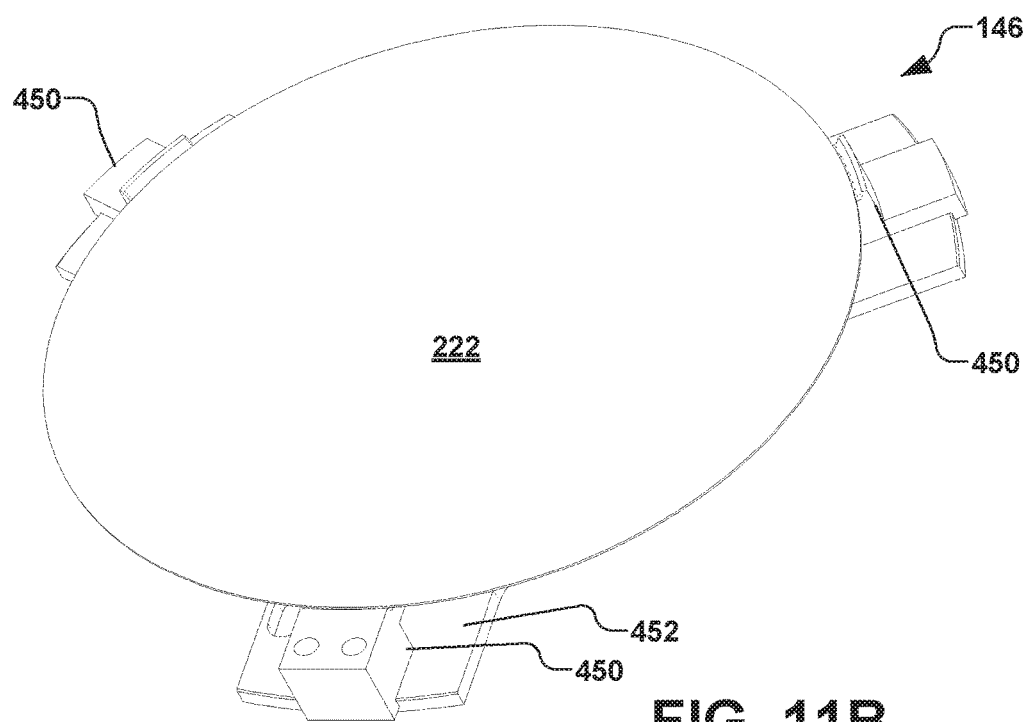

FIGS. 10 and 11A-11B illustrate another exemplary aspect of the disclosure, wherein an exemplary load lock support 146 is provided for supporting the first workpiece 208 and second workpiece 222 within the load lock chamber 136 of FIG. 1. The load lock support 146 of FIG. 10, for example, comprises a plurality of support members 450 are fixedly coupled to a support plate 452. Each support member 450, for example, comprises a first support structure 454 associated with the diameter of the first workpiece 208 (e.g., illustrated in FIG. 11A), and a second support structure 456 associated with the diameter of the second workpiece 222 (e.g., illustrated in FIG. 11B). The first support structure 454 and second support structure 456, for example, each comprise a step 458 or other feature, wherein when the first workpiece 208 is placed on the first support structure, the first workpiece generally resides on a plane that is lower than when the second workpiece 222 is placed on the second support structure. Accordingly, the gripper mechanism 400 of FIGS. 9A-9B is advantageously capable of picking and placing the respective first workpiece 208 and second workpiece 222 within the load lock 136 of FIG. 1 without modification of the load lock support 146.

The number, shape, and orientation of the support members 450, for example, may vary, depending on the number, shape, and size of workpieces to be supported. For example, FIGS. 12A-12C illustrate a support member 470 configured to support three different sized workpieces, wherein an additional third support structure 472 is provided, in addition to the first support structure 454 and second support structure 456. Thus, as illustrated in FIG. 12C, the exemplary support members 470 are configured to support three different sized workpieces 474A-474C (e.g. workpieces having diameters of 100 mm, 150 mm, 200 mm).

Figure 13:
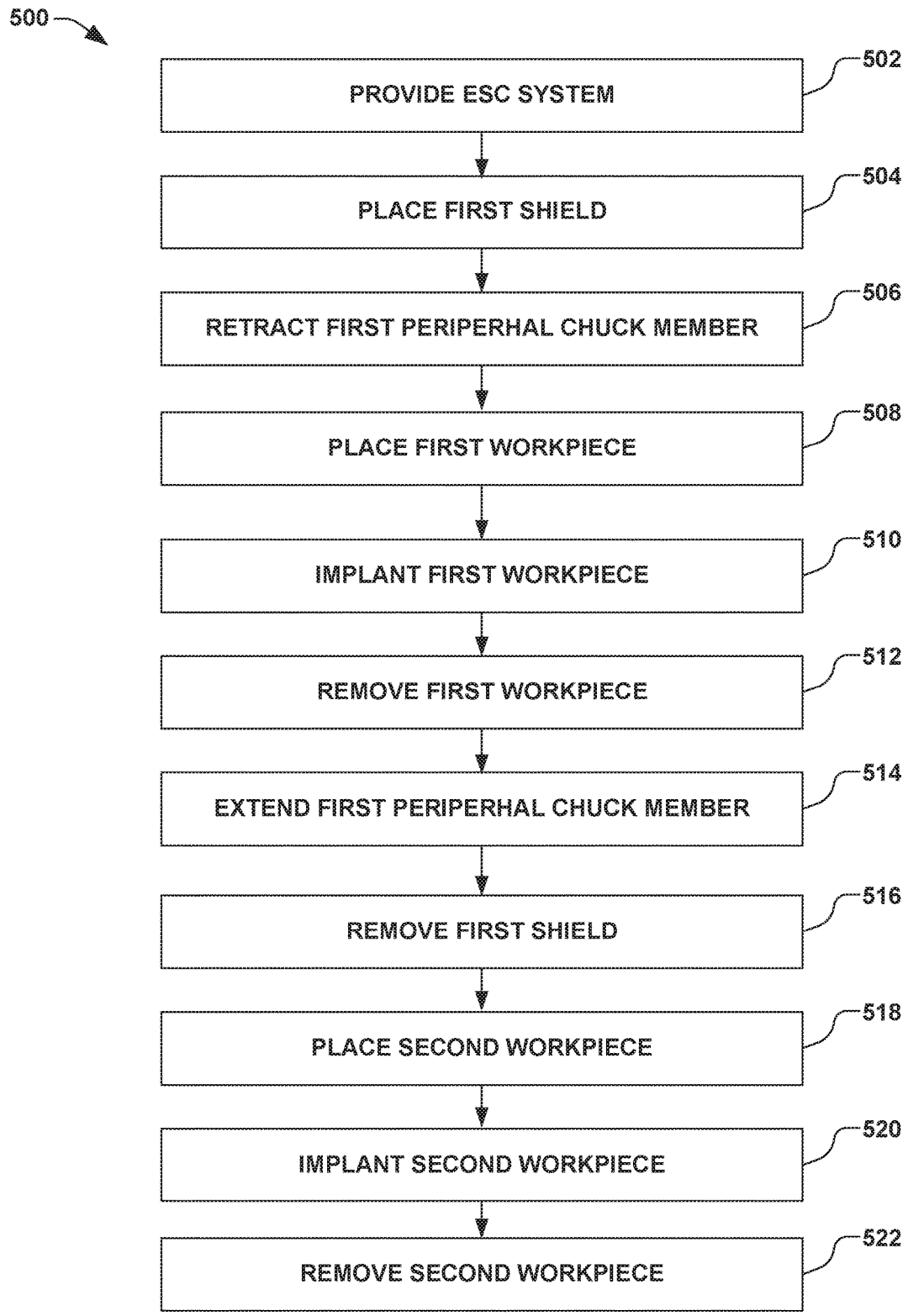
FIG. 13 illustrates a methodology for clamping and implanting ions into workpieces of varying diameters, in accordance with to still another aspect of the disclosure.

In accordance with another exemplary aspect of the disclosure, FIG. 13 illustrates an exemplary method 500 for handling and clamping variable-sized workpieces in an ion implantation system. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 500 of FIG. 13 begins at act 502, wherein a central electrostatic chuck member having a first surface, a first peripheral electrostatic chuck member having a second surface, and a first peripheral shield are provided. In act 504, the first peripheral shield is placed on the second surface of the first peripheral electrostatic chuck member, and in act 506, the first peripheral electrostatic chuck member is retracted with respect to the central electrostatic chuck member. In act 508, the first workpiece is placed on a first surface of the central electrostatic chuck member, and ions may be implanted into the first workpiece by passing an ion beam relative to the first workpiece in act 510.

In act 512, the first workpiece is removed from the central electrostatic chuck member, and the first peripheral electrostatic chuck member is raised with respect to the central electrostatic chuck member in act 514, therein placing the second surface generally co-planar with the first surface. In act 516, the first peripheral shield is removed from the second surface of the first peripheral electrostatic chuck member, and in act 518, the second workpiece is placed on the first surface of the central electrostatic chuck member and a second surface of the first peripheral electrostatic chuck member. In act 520, ions can be implanted into the second workpiece by passing an ion beam (e.g., the same ion beam utilized in act 510 or another ion beam) relative to the second workpiece, and the second workpiece is removed from the central electrostatic chuck member and first peripheral electrostatic chuck member in act 522.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An electrostatic chuck system, comprising:
a scan arm base;
a central electrostatic chuck member having first diameter associated with a diameter of a first workpiece, wherein the central electrostatic chuck member is operably coupled to the scan arm base and has a first surface configured to support and electrostatically clamp the first workpiece thereto;
a first peripheral electrostatic chuck member having a first inner diameter and a first outer diameter, wherein the first peripheral electrostatic chuck member is operably coupled to the scan arm base and has a second surface configured to support a peripheral region of a second workpiece, wherein the diameter of the second workpiece is greater than the diameter of the first workpiece;
an elevator configured to translate the first peripheral electrostatic chuck member with respect to the central electrostatic chuck member between a retracted position and an extended position along an axis generally perpendicular to the first surface, wherein when the first peripheral electrostatic chuck member is in the retracted position, the first surface is proud of the second surface, and wherein when the first peripheral electrostatic chuck member is in the extended position, the first surface and the second surface are generally co-planar; and a first peripheral shield configured to reside on and shield the second surface when the first peripheral electrostatic chuck member is in the retracted position.

2. The electrostatic chuck system of claim 1, wherein the central electrostatic chuck member is fixed with respect to the base, and wherein the elevator is configured to translate the first peripheral electrostatic chuck member between the extended position and the retracted position.

3. The electrostatic chuck system of claim 1, further comprising:

a second peripheral electrostatic chuck member having a second inner diameter and a second outer diameter, wherein the second peripheral electrostatic chuck member is operably coupled to the scan arm base and has a third surface configured to support a peripheral region of a third workpiece, wherein a diameter of the third workpiece is greater than the diameter of the second workpiece, and wherein the elevator is further configured to translate the second peripheral electrostatic chuck member with respect to the central electrostatic chuck member between the retracted position and extended position, wherein when the second peripheral electrostatic chuck member is in the retracted position, the first surface is proud of the third surface, and wherein when the second peripheral electrostatic chuck member is in the extended position, the first surface and the third surface are generally co-planar; and a second peripheral shield configured to reside on and shield the third surface when the second peripheral electrostatic chuck member is in the retracted position and the first peripheral electrostatic chuck member is in the extended position.

4. The electrostatic chuck system of claim 3, further comprising a controller configured to individually control the translation of the first peripheral electrostatic chuck member and second peripheral electrostatic chuck member between the respective retracted and extended position of via a control of the elevator.

5. The electrostatic chuck system of claim 4, further comprising a power supply operably coupled to the central electrostatic chuck member, first peripheral electrostatic chuck member, and second peripheral electrostatic chuck member, and wherein the controller is configured to selectively energize the central electrostatic chuck member, first peripheral electrostatic chuck member, and second peripheral electrostatic chuck member via a control of the power supply.

6. The electrostatic chuck system of claim 5, wherein the controller is configured to energize only the central electrostatic chuck member to electrostatically clamp the first workpiece thereto, to concurrently energize the central electrostatic chuck member and the first peripheral electrostatic chuck member to electrostatically clamp the second workpiece thereto, and to concurrently energize the central electrostatic chuck member, the first peripheral electrostatic chuck member, and the second peripheral electrostatic chuck member to electrostatically clamp the third workpiece thereto.

7. The electrostatic chuck system of claim 3, wherein the first peripheral shield is further configured to reside on and shield the third surface when the first peripheral electrostatic chuck member and second peripheral electrostatic chuck member are in the retracted position.

8. The electrostatic chuck system of claim 7, wherein the second peripheral shield comprises a surface comprised of a semiconductor material.

9. The electrostatic chuck system of claim 7, wherein the second peripheral shield is comprised of a semiconductor material.

10. The electrostatic chuck system of claim 1, further comprising a controller configured to control the retracted and extended position of the first peripheral electrostatic chuck member via a control of the elevator.

11. The electrostatic chuck system of claim 10, further comprising a power supply operably coupled to the central electrostatic chuck member and first peripheral electrostatic chuck member, wherein the controller is configured to concurrently energize the central electrostatic chuck member and first peripheral electrostatic chuck member.

12. The electrostatic chuck system of claim 1, wherein the first peripheral shield is coated with a semiconductor material.

13. The electrostatic chuck system of claim 12, wherein the first peripheral shield comprises an aluminum disc coated with silicon.

14. The electrostatic chuck system of claim 1, wherein the first peripheral shield is comprised of a semiconductor material.

15. The electrostatic chuck system of claim 1, further comprising:

one or more backside gas orifices in one or more of the first surface and second surface; and a backside gas source configured to provide a backside gas to the one or more backside gas orifices.

16. The electrostatic chuck system of claim 15, further comprising one or more gas distribution passages defined in the central electrostatic chuck member and the first peripheral electrostatic chuck member, wherein the one or more of gas distribution passages are in fluid communication with the one or more backside gas orifices.

17. The electrostatic chuck system of claim 16, further comprising:

one or more sidewall orifices defined in a respective sidewall of the central electrostatic chuck member and the first peripheral electrostatic chuck member, wherein the one or more sidewall orifices are in fluid communication the one or more gas distribution passages; and a dynamic seal associated with each of the plurality of the one or more sidewall orifices, wherein the dynamic seal generally permits the translation of the first peripheral electrostatic chuck member with respect to central electrostatic chuck member while preventing a leakage of the backside gas from the one or more sidewall orifices to an external environment.

18. The electrostatic chuck system of claim 17, wherein the backside gas source is operably coupled to the central electrostatic chuck member, wherein the one or more of gas distribution passages provide the backside gas to at least the first peripheral electrostatic chuck member through the one or more sidewall orifices.

19. The electrostatic chuck system of claim 1, further comprising one or more transfer apparatuses configured to selectively transfer the first workpiece, second workpiece, and first peripheral shield to and from the first surface and second surface.

20. The electrostatic chuck system of claim 1, wherein the scan arm base is operatively coupled to a scan arm, wherein the scan arm is configured to selectively translate at least the first workpiece through an ion beam.

21. A method for implanting ions into a first workpiece and a second workpiece, wherein the first workpiece has a smaller diameter than the second workpiece; the method comprising:
providing a central electrostatic chuck member having a first surface, a first peripheral electrostatic chuck member having a second surface, and a first peripheral shield;
placing the first peripheral shield on the second surface of the first peripheral electrostatic chuck member;
retracting the first peripheral electrostatic chuck member with respect to the central electrostatic chuck member, wherein the second surface is recessed from the first surface;
placing the first workpiece on the first surface of the central electrostatic chuck member;
implanting ions into the first workpiece by passing an ion beam relative to the first workpiece;
removing the first workpiece from the central electrostatic chuck member;
raising the first peripheral electrostatic chuck member with respect to the central electrostatic chuck member, wherein the second surface is generally co-planar with the first surface;
removing the first peripheral shield from the second surface of the first peripheral electrostatic chuck member;
placing the second workpiece on the first surface of the central electrostatic chuck member and the second surface of the first peripheral electrostatic chuck member;
implanting ions into the second workpiece by passing another ion beam relative to the second workpiece; and
removing the second workpiece from the central electrostatic chuck member and first peripheral electrostatic chuck member.

22. An electrostatic chuck system, comprising:
a base;
a central electrostatic chuck member operably coupled to the base, wherein the central electrostatic chuck member has a central chuck surface configured to support and electrostatically clamp a first workpiece having a first diameter thereto;
a first peripheral electrostatic chuck member operably coupled to the base, wherein the first peripheral electrostatic chuck member generally surrounds the central electrostatic chuck member, and wherein the first peripheral electrostatic chuck member has a first peripheral chuck surface configured to support and electrostatically clamp a peripheral region of at least a second workpiece, wherein the second workpiece has a second diameter that is greater than the first diameter of the first workpiece;
an elevator configured to selectively translate the first peripheral electrostatic chuck member with respect to the central electrostatic chuck member along an axis generally perpendicular to the central chuck surface between an extended position and a retracted position, wherein the first peripheral chuck surface is generally co-planar with the central chuck surface when at the extended position, and wherein the first peripheral chuck surface resides below the central chuck surface when at the retracted position; and
a first peripheral shield, wherein the first peripheral shield is configured selectively cover the first peripheral chuck surface when the first peripheral electrostatic chuck member is at the retracted position.

23. The electrostatic chuck system of claim 22, further comprising:
a second peripheral electrostatic chuck member operably coupled to the base, wherein the second peripheral electrostatic chuck member generally surrounds the first peripheral electrostatic chuck member, and wherein the second peripheral electrostatic chuck member has a second peripheral chuck surface configured to support and electrostatically attract a peripheral region of at least a third workpiece, wherein the third workpiece has a third diameter that is greater than the second diameter of the second workpiece, and wherein the elevator is further configured to selectively translate the second peripheral electrostatic chuck member with respect to the central electrostatic chuck member along the axis between the extended position and the retracted position, wherein the second peripheral chuck surface is generally co-planar with the central chuck surface when at the extended position, and wherein the second peripheral chuck surface resides below the central chuck surface when at the retracted position; and
a second peripheral shield, wherein the second peripheral shield is configured selectively cover the second peripheral chuck surface when the first peripheral electrostatic chuck member is at the extended position and the second peripheral chuck member is at the retracted position, and wherein the first peripheral shield is further configured to selectively cover both the first peripheral chuck surface and second peripheral chuck surface when the first peripheral electrostatic chuck member and second peripheral chuck member are at the retracted position.

24. The electrostatic chuck system of claim 23, wherein at the respective extended positions, the second peripheral electrostatic chuck member is configured to contact only the third workpiece, the first peripheral electrostatic chuck member is configured to contact the only the second workpiece and third workpiece, and the central electrostatic chuck member is configured to contact any of the first workpiece, second workpiece, and third workpiece.

25. The electrostatic chuck system of claim 23, wherein the third workpiece contacts the central chuck surface, the first peripheral chuck surface, and the second peripheral chuck surface when the first peripheral electrostatic chuck member and second peripheral chuck member are at the respective extended positions.

26. The electrostatic chuck system of claim 23, wherein the first peripheral electrostatic chuck member has a first inner diameter associated with the first diameter of the first workpiece and a first outer diameter associated with the second diameter of the second workpiece.

* * * * *